United States Patent
Qiu et al.

(10) Patent No.: US 11,695,087 B2
(45) Date of Patent: Jul. 4, 2023

(54) BACK CONTACT STRUCTURE AND SELECTIVE CONTACT REGION BURIED SOLAR CELL COMPRISING THE SAME

(71) Applicant: Solarlab Aiko Europe GmbH, Freiburg (DE)

(72) Inventors: Kaifu Qiu, Yiwu (CN); Yongqian Wang, Yiwu (CN); Xinqiang Yang, Yiwu (CN); Gang Chen, Yiwu (CN)

(73) Assignee: SOLARLAB AIKO EUROPE GMBH, Freiburg (DE)

( * ) Notice: Subject to any disclaimer, the term of this patent is extended or adjusted under 35 U.S.C. 154(b) by 0 days.

(21) Appl. No.: 17/541,353

(22) Filed: Dec. 3, 2021

(65) Prior Publication Data
US 2022/0393044 A1 Dec. 8, 2022

Related U.S. Application Data

(63) Continuation of application No. 17/383,492, filed on Jul. 23, 2021, now abandoned.

(30) Foreign Application Priority Data

Jun. 4, 2021 (CN) .......................... 202110627514.X

(51) Int. Cl.
*H01L 31/042* (2014.01)
*H02S 10/00* (2014.01)
(Continued)

(52) U.S. Cl.
CPC .... *H01L 31/022441* (2013.01); *H01L 31/028* (2013.01); *H01L 31/02363* (2013.01); *H01L 31/022466* (2013.01); *H01L 31/0682* (2013.01)

(58) Field of Classification Search
CPC ..... H01L 31/022441; H01L 31/022466; H01L 31/02363; H01L 31/028; H01L 31/0682
See application file for complete search history.

(56) References Cited

U.S. PATENT DOCUMENTS 7,812,250 B2 10/2010 Smith
2011/0000532 A1* 1/2011 Niira .................. H01L 31/0747
257/E31.13

(Continued)

FOREIGN PATENT DOCUMENTS

WO  2018016548 A1  1/2018

OTHER PUBLICATIONS

Armin Richter et al., n-Type Si solar cells with passivating electron contact: Identifying sources for efficiency limitations by wafer thickness and resistivity variation, Solar Energy Materials and Solar Cells, Dec. 2017, pp. 96-105, vol. 173, Elsevier, Amsterdam, Netherlands.

(Continued)

*Primary Examiner* — Angelo Trivisonno
(74) *Attorney, Agent, or Firm* — Matthias Scholl P.C.; Matthias Scholl

(57) ABSTRACT

A back contact structure of a solar cell, includes: a silicon substrate, the silicon substrate including a back surface including a plurality of recesses disposed at intervals; a plurality of first conductive regions and a plurality of second conductive regions disposed alternately in the plurality of recesses, where each first conductive region includes a first dielectric layer and a first doped region which are disposed successively in the plurality of recesses, and each second conductive region includes a second doped region; a second dielectric layer disposed between the plurality of first conductive regions and the plurality of second conductive regions; and a conductive layer disposed on the plurality of (Continued)

first conductive regions and the plurality of second conductive regions.

27 Claims, 10 Drawing Sheets

(51) Int. Cl.
*H02S 30/00* (2014.01)
*H01L 31/0224* (2006.01)
*H01L 31/0236* (2006.01)
*H01L 31/028* (2006.01)
*H01L 31/068* (2012.01)

(56) References Cited

U.S. PATENT DOCUMENTS

| | | | |
|---|---|---|---|
| 2011/0284060 A1* | 11/2011 | Lee | H01L 31/035281 257/E31.124 |
| 2014/0170800 A1* | 6/2014 | Loscutoff | H01L 31/035281 438/98 |
| 2017/0117433 A1 | 4/2017 | Stangl et al. | |
| 2017/0200850 A1* | 7/2017 | Lee | H01L 31/02167 |
| 2019/0245111 A1* | 8/2019 | Yoon | H01L 31/0682 |

OTHER PUBLICATIONS

Christian Reichel et al., Interdigitated Back Contact Silicon Solar Cells Featuring Ion-Implanted Poly-Si/Siox Passivating Contacts, Presented at the 33rd European PV Solar Energy Conference and Exhibition, Sep. 2017, pp. 25-29, Amsterdam, Netherlands.

Andrea Ingenito et al., A passivating contact for silicon solar cells formed during a single firing thermal annealing, Nature Energy, Sep. 2018, pp. 800-808, vol. 3, Nature Research, London, United Kingdom.

Felix Haase et al., Laser contact openings for local poly-Si-metal contacts enabling 26.1%-efficient POLO-IBC solar jells, Solar Energy Materials and Solar Cells, Nov. 2018, pp. 184-193, vol. 186, Elsevier, Amsterdam, Netherlands.

Byungsul Min et al., A 22.3% Efficient p-Type Back Junction Solar Cell with an Al-Printed Front-Side Grid and a Passivating n+-Type Polysilicon on Oxide Contact at the Rear Side, Solar RRL, Dec. 2020, pp. 1-4 of 200435, vol. 4 No. 12, Wiley-VCH GmbH, Weinheim, Germany.

Puqun Wang et al., Development of TOPCon tunnel-IBC solar cells with screen-printed fire-through contacts by laser patterning, Solar Energy Materials and Solar Cells, Jan. 2021, pp. 1-8 of 110834, vol. 220, Elsevier, Amsterdam, Netherlands.

* cited by examiner

BACK CONTACT STRUCTURE AND SELECTIVE CONTACT REGION BURIED SOLAR CELL COMPRISING THE SAME

CROSS-REFERENCE TO RELATED APPLICATIONS

This application is a continuation of U.S. application Ser. No. 17/383,492, filed Jul. 23, 2021, and further claims foreign priority benefits to Chinese Patent Application No. 202110627514.X, filed Jun. 4, 2021. The contents of all of the aforementioned applications, including any intervening amendments thereto, are incorporated herein by reference. Inquiries from the public to applicants or assignees concerning this document or the related applications should be directed to: Matthias Scholl P.C., Attn.: Dr. Matthias Scholl Esq., 245 First Street, 18th Floor, Cambridge, Mass. 02142.

BACKGROUND

The disclosure relates to the field of solar cells, and more particularly to a back contact structure and a selective contact region buried solar cell comprising the same.

In a crystalline silicon solar cell, efficiency losses of the cell may be divided into two aspects, i.e., electric losses and optical losses. Important parts of the electric losses are composite losses and resistance losses caused by metal-semiconductor contacts, while an important part of the optical losses is a shading of metal grid lines of illuminated faces.

A passivated metal contact structure has remarkable electrical performance, and can obtain a low contact resistivity and low surface composition at the same time; this structure comprises an ultrathin tunneling oxide layer and an N-type doped or P-type doped polycrystalline silicon layer. Since the absorption of light by the doped polycrystalline silicon layer belongs to "parasitic" absorption, i.e., no contribution to a photo-generated current, the passivated metal contact structure is chiefly applied to a back of the cell, so that a front surface thoroughly avoids the shading of the metal grid lines. Solar radiation received on the solar cell generates electrons and holes; these electrons and holes are migrated to the doped polycrystalline silicon layer, to generate a voltage difference in the doped polycrystalline silicon layer. Currently, it is available to configure that a solar cell is composed of the foregoing passivated metal contact structure and another passivated metal contact structure, or a solar cell is composed of the foregoing passivated metal contact structure and a diffusion structure.

The existing passivated metal contact structure and the diffusion structure are directly deposited on a back of a silicon slice; however, when they are connected to each other without separation, undesirable phenomena such as electric leakage would occur.

Hence, to solve the problem of no separation above, by forming an ultra-condensed trench between the passivated metal contact structure and the diffusion structure, the passivated metal contact structure is separated from the diffusion structure, to prevent a cell open-circuit voltage reduction from electric leakage. However, the existing trench is prepared through laser perforation or wet etching; in this case, since the width of the existing trench is dozens of microns, and thus width control is highly required, so that the preparation is difficult. Besides, the passivation is performed using only a single dielectric layer; however, using the single dielectric layer for passivation has a relatively poor passivation effect and a poor inner back reflection effect.

SUMMARY

An objective of an embodiment of the disclosure is to provide a back contact structure of a solar cell, aiming at solving the existing problems of a high trench width control requirement and a poor passivation effect.

The disclosure provides a back contact structure of a solar cell, the back contact structure comprising:
- a silicon substrate, the silicon substrate comprising a back surface comprising a plurality of recesses disposed at intervals;
- a plurality of first conductive regions and a plurality of second conductive regions disposed alternately in the plurality of recesses, wherein each first conductive region comprises a first dielectric layer and a first doped region which are disposed successively in the plurality of recesses, and each second conductive region comprises a second doped region;
- a second dielectric layer disposed between the plurality of first conductive regions and the plurality of second conductive regions, wherein the second dielectric layer is at least one in number; and
- a conductive layer disposed on the plurality of first conductive regions and the plurality of second conductive regions.

In a class of this embodiment, the first doped region is a P-type doped region, and the second doped region is an N-type doped layer; or the first doped region is an N-type doped region, and the second doped region is a P-type doped layer.

In a class of this embodiment, the first doped region comprises doped polycrystalline silicon, doped silicon carbide or doped amorphous silicon.

In a class of this embodiment, the first dielectric layer comprises a tunneling oxide layer, an intrinsic silicon carbide layer and an intrinsic amorphous silicon layer, or a combination thereof.

In a class of this embodiment, the second dielectric layer comprises an aluminum oxide layer, a silicon nitride layer, a silicon oxynitride layer, an intrinsic silicon carbide layer, an intrinsic amorphous silicon layer and a silicon oxide layer, or a combination thereof.

In a class of this embodiment, the second dielectric layer covers regions between the first conductive regions and the second conductive regions, or extends to cover the first conductive regions and/or the second conductive regions.

In a class of this embodiment, the back surface of the silicon substrate located on regions between the first conductive regions and the second conductive regions comprises a rough texture structure.

In a class of this embodiment, a first doped layer having the same conductivity type as the first doped region is disposed in the silicon substrate located on regions between the first conductive regions and the second conductive regions.

In a class of this embodiment, the first dielectric layer covers bottom walls and sidewalls of the plurality of recesses, or extends to cover regions between the plurality of recesses.

In a class of this embodiment, the first doped regions and/or the second doped regions extend to part of the regions between the plurality of recesses.

In a class of this embodiment, the plurality of recesses is the shape of an arc, a trapezoid, or a square.

In a class of this embodiment, the thickness of the first dielectric layer is 1-20 nm, and the thickness of the plurality of first conductive regions is greater than 20 nm.

In a class of this embodiment, the second doped region has a junction depth of 0.01-1 μm, a sheet resistance of 10-500 ohm/sqr, and a surface concentration of 1E18-1E21 $cm^{-3}$.

In a class of this embodiment, the depth of the plurality of recesses is 0.01-10 μm, and the distances between every two adjacent recesses is 20-500 m.

In a class of this embodiment, the width of the plurality of recesses of the P-type doped region is set to be 300-600 μm, or, the width of the plurality of recesses of the N-type doped region is set to be 100-500 μm.

In a class of this embodiment, the doped silicon carbide comprises doped hydrogenated silicon carbide.

In a class of this embodiment, the first dielectric layer comprises the tunneling oxide layer and the intrinsic silicon carbide layer.

In a class of this embodiment, the tunneling oxide layer comprises one or more of a silicon oxide layer and an aluminum oxide layer.

In a class of this embodiment, the intrinsic silicon carbide layer in the first dielectric layer comprises an intrinsic hydrogenated silicon carbide layer.

In a class of this embodiment, the second dielectric layer comprises the aluminum oxide layer and the intrinsic silicon carbide layer or the silicon oxide layer and the intrinsic silicon carbide layer, and the thickness of the second dielectric layer is greater than 25 nm.

In a class of this embodiment, the thickness of the aluminum oxide layer or the silicon oxide layer in the second dielectric layer is less than 25 nm, and the thickness of the intrinsic silicon carbide layer in the second dielectric layer is greater than 10 nm.

In a class of this embodiment, the intrinsic silicon carbide layer in the second dielectric layer comprises at least one first intrinsic silicon carbide film.

In a class of this embodiment, the refractive indexes of the first intrinsic silicon carbide films successively decrease outward from the back surface of the silicon substrate.

In a class of this embodiment, a magnesium fluoride layer is disposed at an outer layer of the second dielectric layer.

In a class of this embodiment, the conductive layer is a TCO (transparent conductive oxide) film and/or a metal electrode.

In a class of this embodiment, the metal electrode comprises a silver electrode, a copper electrode, an aluminum electrode, a tin-clad copper electrode, or a silver-clad copper electrode.

In a class of this embodiment, the copper electrode is electro-plated copper prepared through an electroplating process or a copper electrode prepared through physical vapor deposition.

The objective of another embodiment of the disclosure is to further provide a selective contact region buried solar cell, comprising:
the aforesaid back contact structure; and
a third dielectric layer disposed on a front surface of the silicon substrate.

In a class of this embodiment, the third dielectric layer comprises an aluminum oxide layer, a silicon nitride layer, a silicon oxynitride layer, a silicon carbide layer, an intrinsic amorphous silicon layer and a silicon oxide layer, or a combination thereof.

In a class of this embodiment, the third dielectric layer comprises the silicon oxide layer and the silicon carbide layer or the aluminum oxide layer and the silicon carbide layer, and the thickness of the third dielectric layer is greater than 50 nm.

In a class of this embodiment, the thickness of the aluminum oxide layer or the silicon oxide layer in the third dielectric layer is less than 40 nm, and the thickness of the silicon carbide layer in the third dielectric layer is greater than 10 nm.

In a class of this embodiment, the silicon carbide layer in the third dielectric layer comprises at least one silicon carbide film.

In a class of this embodiment, the silicon carbide layer in the third dielectric layer comprises at least one silicon carbide film; and refractive indexes of different silicon carbide films decrease from the front surface of the silicon substrate to outside.

In a class of this embodiment, a magnesium fluoride layer is disposed at an outer layer of the third dielectric layer.

The objective of another embodiment of the disclosure is to further provide a cell assembly, comprising the selective contact region buried solar cell as stated above.

The objective of another embodiment of the disclosure is to further provide a photovoltaic system, comprising the cell assembly as stated above.

The objective of another embodiment of the disclosure is to further provide a selective contact region buried solar cell manufacturing method, comprising:
forming a plurality of recesses disposed at intervals on a back of a silicon substrate;
preparing, inside the plurality of recesses, first conductive regions and second conductive regions disposed alternately, wherein each first conductive region comprises a first dielectric layer and a first doped region which are disposed successively in the recess, and each second conductive region comprises a second doped region;
respectively preparing a second dielectric layer and a third dielectric layer on the back and front surface of the silicon substrate; and
preparing a conductive layer on the first conductive regions and the second conductive regions.

In a class of this embodiment, the step of preparing, inside the plurality of recesses, first conductive regions and second conductive regions disposed alternately comprises:
successively preparing the first dielectric layer and the first doped region having a first conductivity type inside a first recess; and
preparing the second doped region having a second conductivity type inside a second recess adjacent to the first recess, where the first conductivity type is opposite to the second conductivity type.

In a class of this embodiment, the step of successively preparing the first dielectric layer and the first doped region having a first conductivity type inside a first recess comprises:
preparing the first dielectric layer in the first recess;
depositing intrinsic amorphous silicon or intrinsic silicon carbide on the first dielectric layer; and
performing the first conductivity type of doping on the intrinsic amorphous silicon or the intrinsic silicon carbide; and
performing high-temperature crystallization treatment, so that the intrinsic amorphous silicon or the intrinsic silicon carbide is changed into doped polycrystalline silicon or doped silicon carbide to obtain the first doped region having the first conductivity type.

In a class of this embodiment, the step of successively preparing the first dielectric layer and the first doped region having a first conductivity type inside a first recess comprises:

preparing the first dielectric layer inside the first recess;

depositing intrinsic amorphous silicon or intrinsic silicon carbide on the first dielectric layer; and performing the first conductivity type of diffusion on the intrinsic amorphous silicon or the intrinsic silicon carbide, so that the intrinsic amorphous silicon or the intrinsic silicon carbide is changed into doped polycrystalline silicon or doped silicon carbide to obtain the first doped region having the first conductivity type.

In a class of this embodiment, the step of successively preparing the first dielectric layer and the first doped region having a first conductivity type inside a first recess comprises:

preparing the first dielectric layer inside the first recess;

depositing the first conductivity type of doped amorphous silicon or doped amorphous silicon carbide on the first dielectric layer; and performing high-temperature crystallization treatment, so that the doped amorphous silicon or the doped amorphous silicon carbide is changed into doped polycrystalline silicon or doped silicon carbide to obtain the first doped region having the first conductivity type.

In a class of this embodiment, the step of preparing the second doped region having a second conductivity type inside a second recess adjacent to the first recess comprises:

introducing a source gas corresponding to the second conductivity type for thermal diffusion inside the second recess to form the second doped region having the second conductivity type; or depositing or spin-coating a doping source corresponding to the second conductivity type for thermal diffusion inside the second recess to form the second doped region having the second conductivity type; or injecting ions corresponding to the second conductivity type for thermal diffusion inside the second recess to form the second doped region having the second conductivity type.

In a class of this embodiment, the step of performing the first conductivity type of doping on the intrinsic amorphous silicon or the intrinsic silicon carbide comprises:

injecting the first conductivity type of ions onto the intrinsic amorphous silicon or the intrinsic silicon carbide for doping; or depositing the first conductivity type of doping sources on the intrinsic amorphous silicon or the intrinsic silicon carbide for doping; or introducing the first conductivity type of source gas onto the intrinsic amorphous silicon or the intrinsic silicon carbide for doping.

In the back contact structure of a solar cell provided in the embodiment of the disclosure, recesses are disposed at intervals on a back of a silicon substrate, and first conductive regions and second conductive regions are disposed alternately inside the plurality of recesses, so that separation between the first conductive regions and the second conductive regions inside the plurality of recesses is implemented through a protrusion structure of the silicon substrate itself between the plurality of recesses; moreover, the plurality of recesses disposed have a higher tolerance in width control than existing trenches, so the preparation of the plurality of recesses is easier than preparation of the existing trenches. Further, when a first dielectric layer and first doped regions are deposited inside the plurality of recesses, the deposition effect is better because of the higher tolerance in width control. In addition, a first conductive region having the first dielectric layer and the first doped region is disposed in one recess, and a second conductive region having a second doped region is disposed in another adjacent recess, so that fabrication processes can be reduced and the cost is lowered, comparing with the case that both recesses disposed with a first dielectric layer and a first doped region. In addition, since the arrangement of the plurality of recesses enables the first dielectric layer to be in contact with both bottom walls and sidewalls of the recesses, the carriers generated in the silicon substrate would also be easily separated through the first dielectric layer on the sidewalls of the recesses and selectively collected into the corresponding first doped regions, so that current leakage can be reduced and selective transport of the carriers in longitudinal and transverse directions can also be implemented, thereby facilitating multi-dimensional collection of the carriers on the bottom walls and sidewalls of the recesses. Since a second dielectric layer disposed is at least one in number, multi-layer induced passivation is achieved on the back surface of the silicon substrate through the second dielectric layer having at least one layer, and inner back reflection is enhanced, thereby solving the existing problems of a high trench width control requirement and a poor passivation effect and a poor inner back reflection.

DETAILED DESCRIPTION

Figure 1:
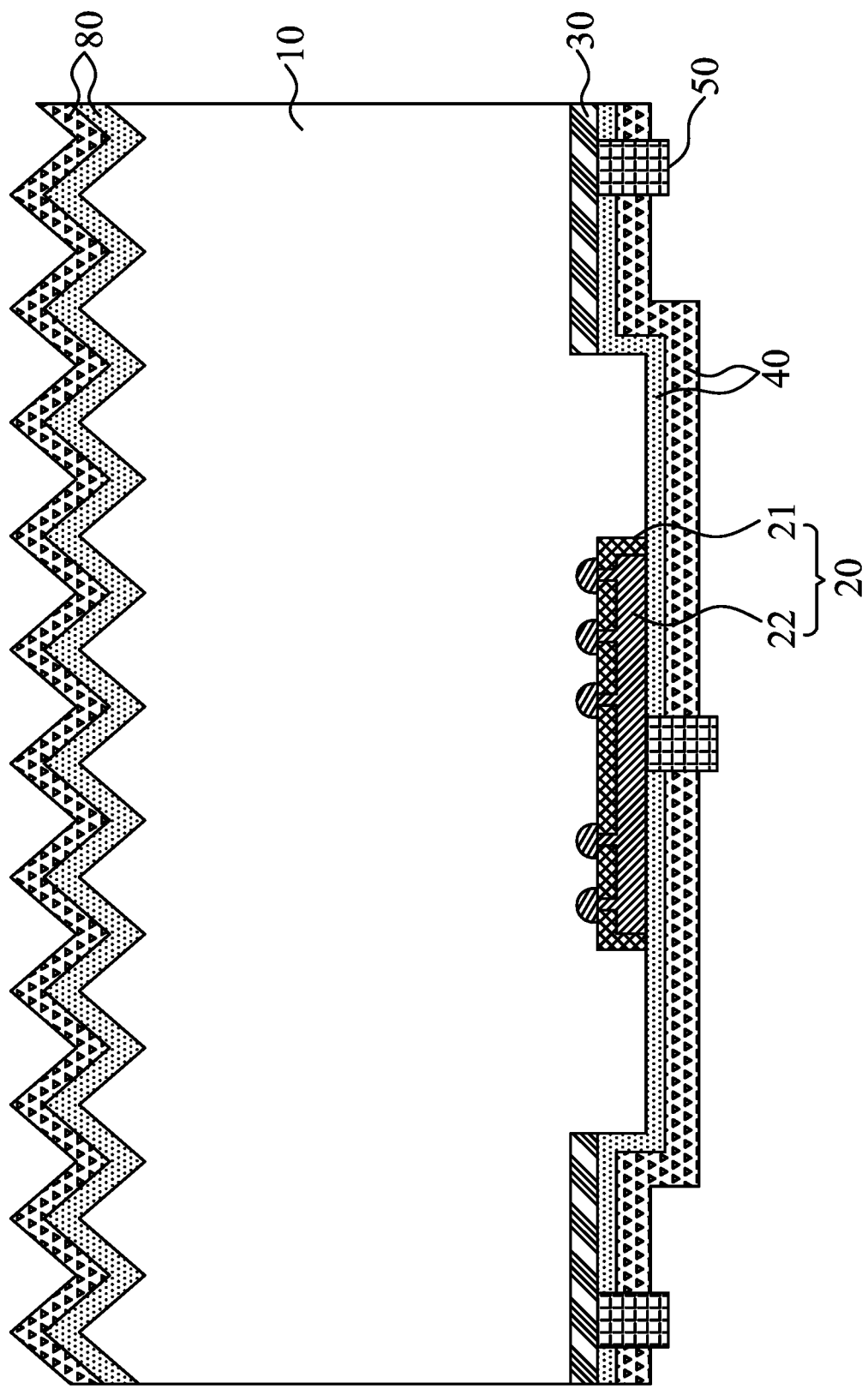
FIG. 1 to FIG. 9 are structural schematic diagrams of various implementations of a selective contact region buried solar cell provided by one embodiment of the disclosure.

To make the objective, technical solutions, and advantages of the disclosure clearer, the following further describes the disclosure in detail in conjunction with the accompanying drawings and embodiments. It should be understood that the specific embodiments described herein are merely used for explaining the disclosure but are not intended to limit the disclosure.

In the disclosure, unless otherwise specified and defined, the terms such as "mount", "connected with", "connected to" and "fix" should be comprehended in a broad sense. For example, these terms may be comprehended as being fixedly connected, detachably connected or integrally connected; or mechanically connected, or electrically connected; or directly connected, or indirectly connected through an intermediate medium, or in an internal communication between two elements. The specific meanings about the foregoing terms in the disclosure may be understood by those skilled in the art according to specific circumstances. The term "and/or" used in the text comprises any or all combinations of one or more related listed items.

In the disclosure, recesses are disposed at intervals on a back of a silicon substrate, and first conductive regions and second conductive regions are disposed alternately in the recesses, so that separation between the first conductive regions and the second conductive regions inside the recesses is implemented through a protrusion structure between the recesses of the silicon substrate; moreover, the recesses disposed have a lower width control requirement than existing trenches, and preparation of the recesses is easier than preparation of the existing trenches. Further, when a first dielectric layer and first doped regions are deposited inside the recesses, the deposition effect is better. In addition, a first conductive region having the first dielectric layer and the first doped region is disposed in one recess, and a second conductive region having a second doped region is disposed in another adjacent recess, so that technological processes can be reduced in preparation steps and the cost is lowered. In addition, since the arrangement of the recesses enables the first dielectric layer to be in contact with both bottom walls and sidewalls of the recesses, the carriers generated on the silicon substrate would also be easily separated through the first dielectric layer on the sidewalls of the recesses and selectively collected into the corresponding first doped regions, so that leakage current can be reduced and selective transport of the carriers in longitudinal and transverse directions can also be implemented, thereby facilitating multi-dimensional collection of the carriers on the bottom walls and sidewalls of the recesses. Since a second dielectric layer disposed is at least one in number, multi-layer passivation is achieved on the back surface of the silicon substrate through the second dielectric layer having at least one layer, and inner back reflection is enhanced, thereby yielding a better passivation effect and a better inner back reflection effect and solving the existing problems of a high groove width control requirement and a poor passivation effect.

Embodiment 1

The first embodiment of the disclosure provides a back contact structure of a solar cell. To facilitate explanation, merely the parts related to the embodiment of the disclosure are illustrated. With reference to FIG. 1 to FIG. 9, the back contact structure of the solar cell provided by the embodiment of the disclosure comprises:

a silicon substrate 10 comprising a back surface comprising a plurality of recesses disposed at intervals;

a plurality of first conductive regions 20 and a plurality of second conductive regions 30 disposed alternately in the recesses, where each first conductive region 20 comprises a first dielectric layer 21 and a first doped region 22 which are disposed successively in the recess, and each second conductive region 30 comprises a second doped region;

a second dielectric layer 40 disposed between the first conductive regions 20 and the second conductive regions 30, where the second dielectric layer 40 is at least one in number and the refractive index successively decreases outward from the back surface of the silicon substrate 10; and conductive layers 50 disposed on the plurality of first conductive regions 20 and the plurality of second conductive regions 30, wherein the conductive layers corresponding to the first conductive regions is the same as or different from the conductive layers corresponding to the second conductive regions.

In one embodiment of the disclosure, the silicon substrate 10 has a front facing the sun and a back opposite to the front during a normal working period, and the front is an illuminated face; the back is disposed on the other side of the silicon substrate 10 with respect to the front, i.e., the front and the back are located on different sides, i.e., opposite sides, of the silicon substrate 10, where in this embodiment, the silicon substrate 10 is an N-type silicon slice, and it can be understood that, in other embodiments, the silicon substrate 10 may also be another silicon slice. The recesses are formed at intervals on the back surface of the silicon substrate 10; the recesses can be formed through laser ablation or through a combination of a mask (such as a hard mask, a silicon oxide mask, a silicon nitride mask, and a photoresist mask) and wet/dry etching; in this case, due to the recesses formed at intervals on the back surface of the silicon substrate 10, a region between two adjacent recesses located on the silicon substrate 10 is roughly in a protrusion shape, and thus a back pattern of the silicon substrate 10 generally appears to be formed by staggering the recesses and protrusions.

Furthermore, in one embodiment of the disclosure, the first conductive regions 20 and the second conductive regions 30 are disposed alternately inside the recesses, specifically, each first conductive region 20 comprises the first dielectric layer 21 and the first doped region 22 which are successively disposed in the recess, and the second conductive region 30 comprises the second doped region. Furthermore, in one embodiment of the disclosure, the first doped region 22 and the second doped region have opposite conductivity types, where the first doped region 22 is a P-type doped region, and the second doped region is an N-type doped layer; or the first doped region 22 is an N-type doped region, and the second doped region is a P-type doped layer.

Figure 2:
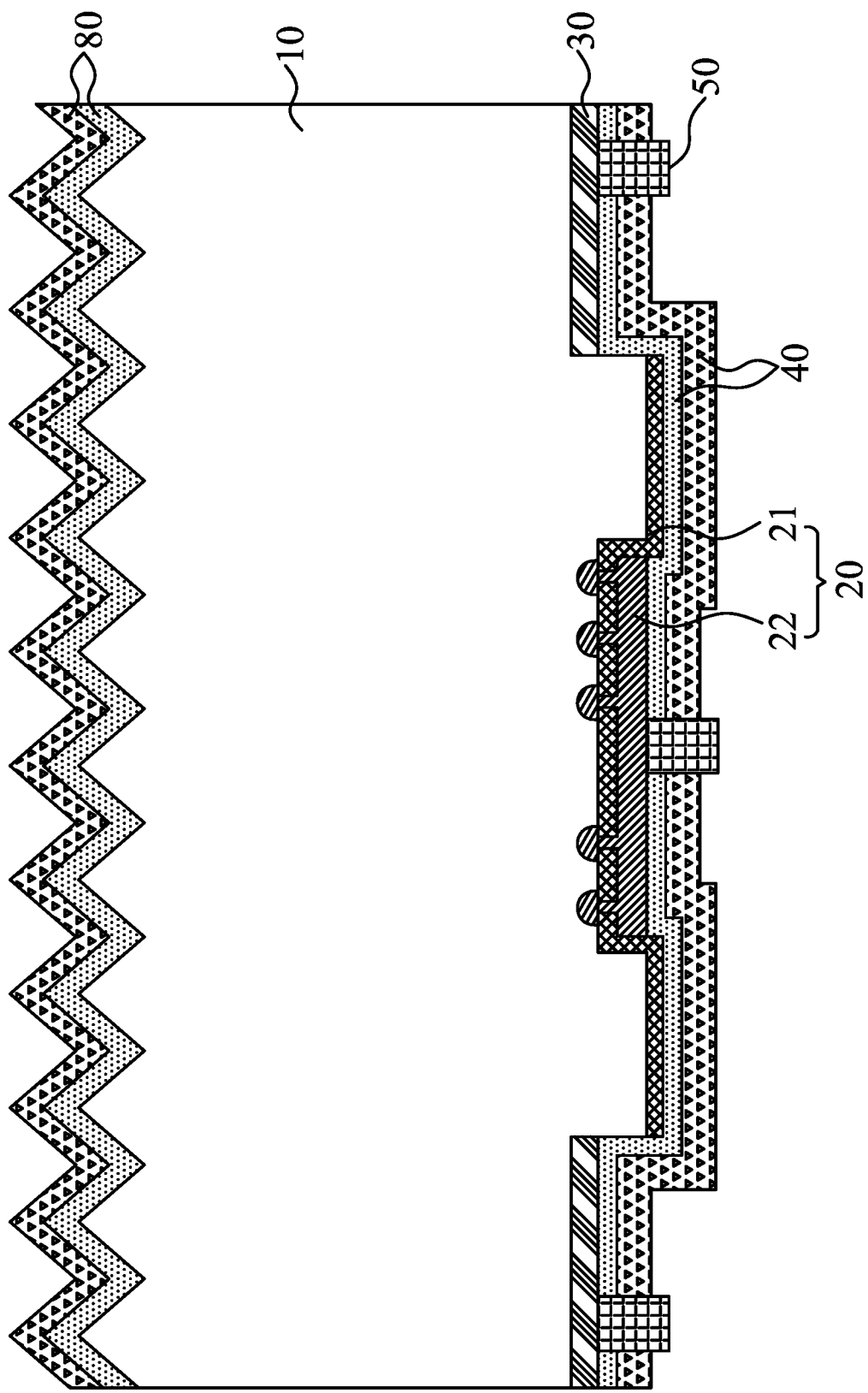

Furthermore, in one embodiment of the disclosure, the first dielectric layer 21 is located on the back surface of the silicon substrate 10 and at least covers the recesses where the first dielectric layer is located, where the first dielectric layer 21 covering the recesses where the first dielectric layer is located specifically indicates covering bottom walls and sidewalls of the recesses. Therefore, in this case, the first dielectric layer 21 is connected to the bottom walls and sidewalls of the recesses. Or, the first dielectric layer 21 may further extend to cover regions (i.e., protrusion regions) between the recesses, and the first dielectric layer 21 may further extend to cover sidewalls of the recesses where the second conductive regions 30 are located to get close or adjacent to the second doped regions. In one embodiment of the disclosure, as shown in FIG. 1, the first dielectric layer 21 covers the recesses where the first dielectric layer is located. In another embodiment of the disclosure, as shown in FIG. 2, the first dielectric layer 21 covers the recesses where the first dielectric layer is located and the regions between the recesses.

Furthermore, in one embodiment of the disclosure, the first dielectric layer 21 is located between the silicon substrate 10 and the first doped regions 22 disposed inside the recesses, and is used as a tunneling structure; moreover, the first dielectric layer 21 and the first doped regions 22 connected thereto and covered thereby together form a passivated contact structure. The passivated contact structure provides good surface passivation for the back surface of the silicon substrate 10; in addition, generally speaking, the first dielectric layer 21 has a thin enough thickness, in which one type of the carriers achieves selective transmission through a tunneling principle, while another type of the carriers is hard to tunnel through the first dielectric layer 21 due to the existence of a barrier and a doped region field effect. Therefore, the first dielectric layer 21 may allow one type of the carriers to tunnel through and enter the first doped regions 22 while blocking another type of the carriers from passing through to cause composition, so that interface composition can be obviously reduced, the solar cell has relatively high open-circuit voltage and short-circuit current, and then photovoltaic conversion efficiency is improved. In addition, as shown in FIG. 1 to FIG. 9, a plurality of inner diffusion regions corresponding to the first doped regions 22 are formed on the surface of the silicon substrate 10 in contact with the first dielectric layer 21. In addition, in this embodiment, since the arrangement of the recesses enables the first dielectric layer 21 to be in contact with both bottom walls and sidewalls of the recesses, the carriers generated on the silicon substrate 10 would also be easily separated through the first dielectric layer 21 on the sidewalls of the recesses and selectively collected into the first doped regions 22, thereby facilitating multi-dimensional collection of the carriers on the bottom walls and sidewalls of the recesses.

Furthermore, in one embodiment of the disclosure, the first dielectric layer 21 is preferably a tunneling oxide layer, an intrinsic silicon carbide layer and an intrinsic amorphous silicon layer, or a combination thereof. As some examples of the disclosure, for example, the first dielectric layer 21 may be a tunneling oxide layer of a single material, may also be a combination of a tunneling oxide layer and the intrinsic amorphous silicon layer of multiple materials, and may further be a combination of multiple layers of intrinsic amorphous silicon having different refractive indexes of a single material. It can be understood that the specific structural arrangement of the first dielectric layer 21 comprises, but not limited to, the several modes listed above, and according to actual usage needs, the first dielectric layer 21 is correspondingly configured, which is not specifically limited herein.

In a preferable embodiment of the disclosure, specifically, the first dielectric layer 21 is preferably the tunneling oxide layer and the intrinsic silicon carbide layer; in this case, the tunneling oxide layer and the intrinsic silicon carbide layer are successively arranged outward from the silicon substrate 10, the tunneling oxide layer is in contact with the back surface of the silicon substrate 10 inside the recesses, and the intrinsic silicon carbide layer is in contact with the first doped regions 22. Furthermore, the tunneling oxide layer preferably comprises one or more of a silicon oxide layer and an aluminum oxide layer. Hence, the first dielectric layer 21 may also be a combination of the silicon oxide layer and the aluminum oxide layer in the tunneling oxide layer. The intrinsic silicon carbide layer in the first dielectric layer 21 comprises an intrinsic hydrogenated silicon carbide layer. In this case, the tunneling oxide layer and the intrinsic silicon carbide layer reduce the density of interface states between the silicon substrate 10 and the first doped regions 22 through chemical passivation. For example, hydrogen in the intrinsic hydrogenated silicon carbide layer enters the silicon substrate 10 under the function of a diffusion mechanism and a thermal effect, to neutralize dangling bonds of the back surface of the silicon substrate 10, to passivate defects of the back surface of the silicon substrate 10, and to transfer an energy band in a forbidden band to a valence band or a conduction band to improve probability for the carriers to enter the first doped regions 22 through the first dielectric layer 21.

Generally speaking, as some specific examples of the disclosure, during specific usage, the first dielectric layer 21 preferably adopts the silicon oxide layer of 1-2 nm and the intrinsic silicon carbide layer of 2-5 nm; as compared with only using the silicon oxide layer as the tunneling structure, the intrinsic silicon carbide layer may further provide an additional hydrogen passivation effect; a preparing process window of the tunneling structure is enlarged, without influencing the tunneling effect; certainly, the silicon oxide layer of 1-2 nm, or the silicon oxide layer of 1 nm and the aluminum oxide layer of 1 nm, or two or more of the intrinsic silicon carbide layers having different refractive indexes can also be directly adopted; as can be understood, the specific structure arrangement of the first dielectric layer 21 comprises, but not limited to, the several specific examples listed above. In addition, the first dielectric layer 21 may also be an intrinsic microcrystalline silicon layer, an intrinsic microcrystalline silicon oxide layer, an intrinsic amorphous silicon oxide layer, etc. As shown in FIG. 1 to FIG. 9, it is only shown that the first dielectric layer 21 is a one-layer structure; as can be understood, the specific structure of the first dielectric layer 21 is set according to actual needs and does not completely follow the accompanying drawings of the description.

Furthermore, in one embodiment of the disclosure, the first doped region 22 preferably comprises doped polycrystalline silicon or doped silicon carbide or doped amorphous silicon, where the doped silicon carbide may comprise doped hydrogenated silicon carbide, and the doped hydrogenated silicon carbide is specifically formed by adding hydrogen when depositing the silicon carbide. It should be indicated that when the first dielectric layer 20 comprises the silicon oxide layer and the intrinsic silicon carbide layer, the first doped region 22 is specifically doped silicon carbide. Moreover, when the first dielectric layer 20 comprises the silicon oxide layer or other combinations, the first doped region 22 may be doped polycrystalline silicon or the like. When the first dielectric layer 20 is the intrinsic amorphous silicon layer, the first doped region is specifically doped amorphous silicon.

Figure 3:
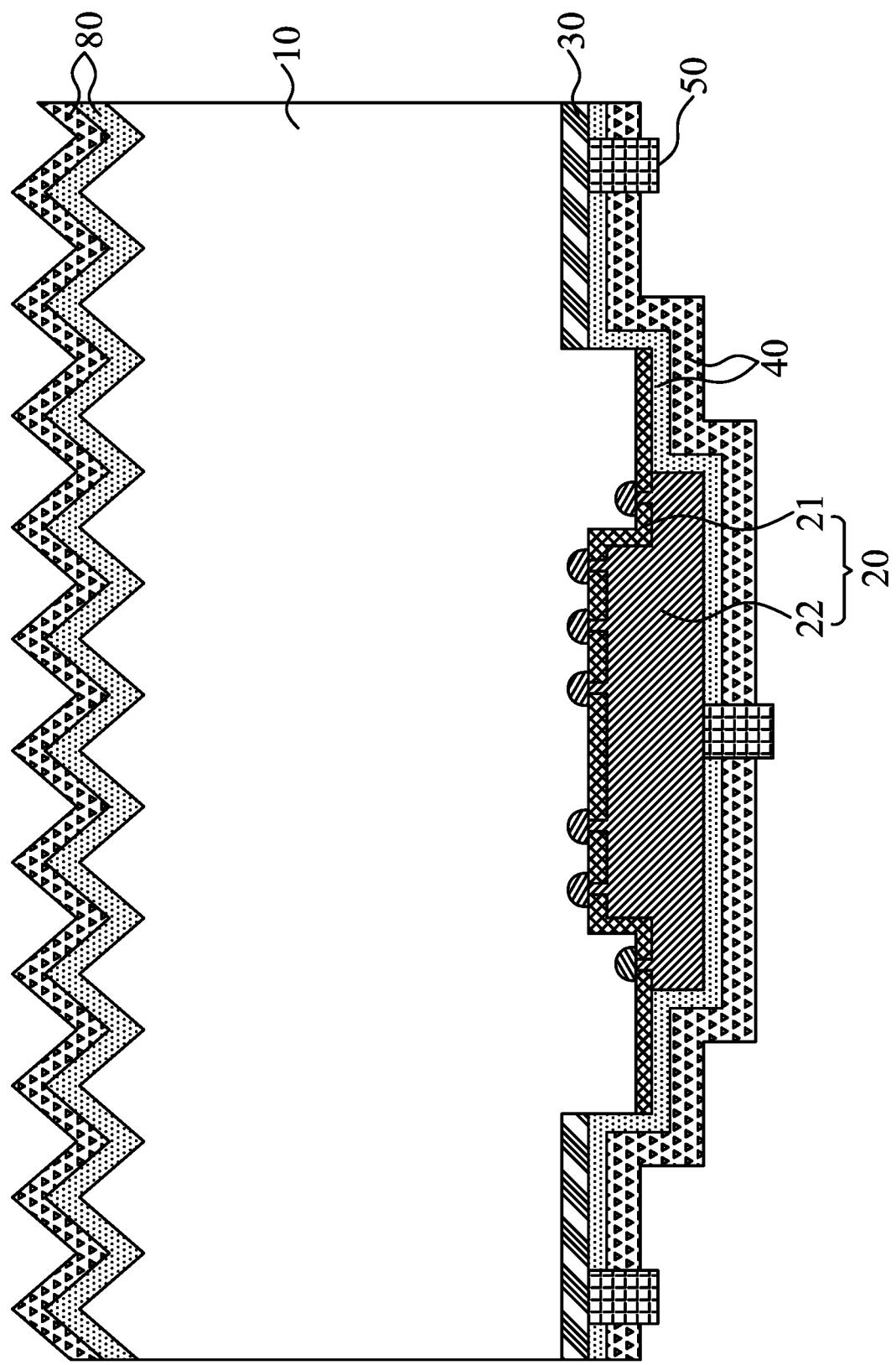
Figure 4:
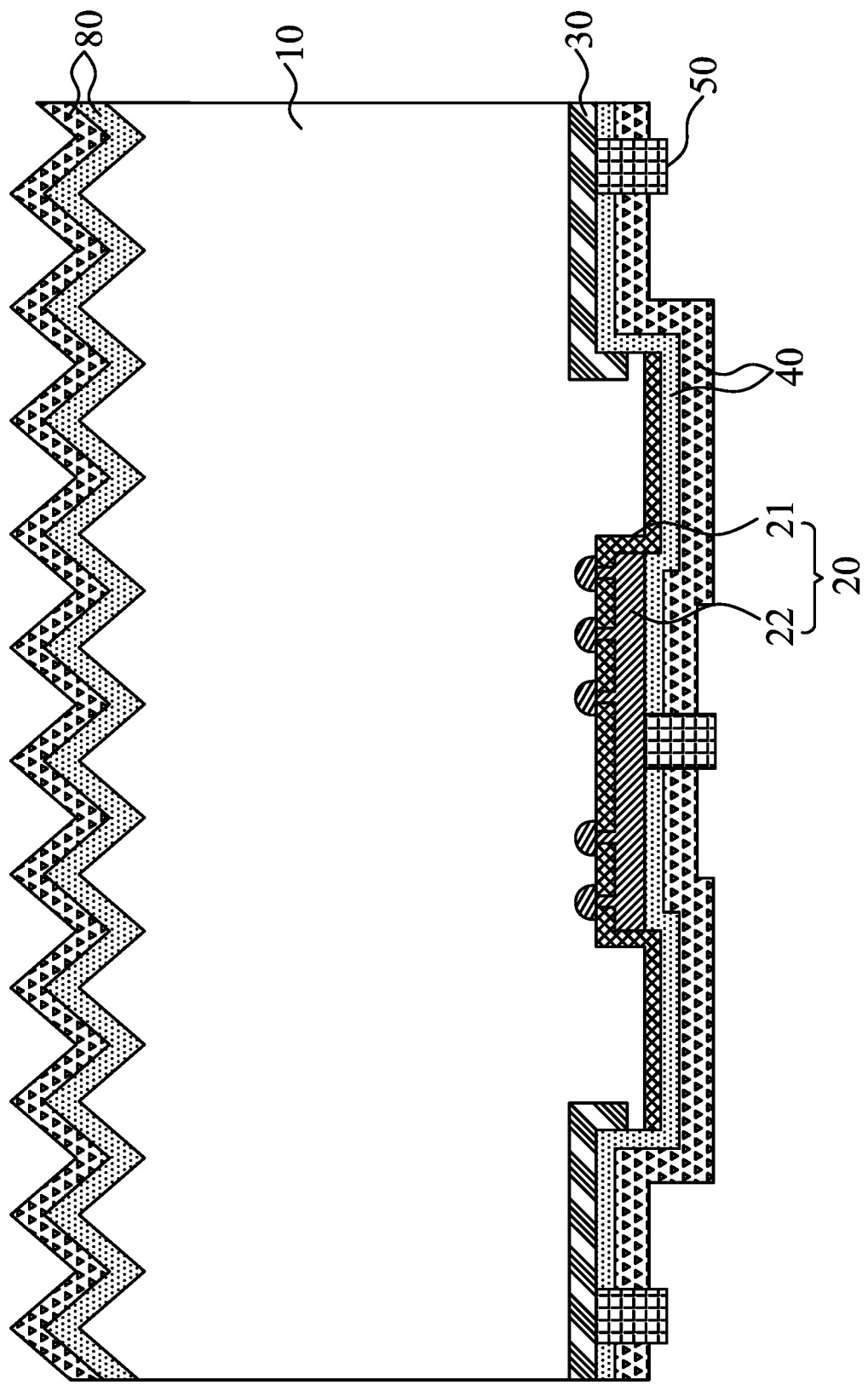

Furthermore, in one embodiment of the disclosure, the first conductive region 20 comprising the first dielectric layer 21 and the first doped region 22 is disposed inside the recess through deposition or the like. In this case, the thickness of the first dielectric layer 21 is 1-20 nm, the thickness of the first conductive layer 20 is greater than 20 nm, i.e., the total thickness of the first dielectric layer 21 and the first doped region 22 is greater than 20 nm, the depth of the plurality of recesses is set to be 0.01-10 μm, and the distance between the recesses is 20-500 m. Therefore, the total thickness of the first conductive region 20 may be greater than or less than or equal to the depth of the recess, i.e., the first conductive region 20 may be disposed inside the recess or may be disposed extending out of the recess. It should be indicated that, in one embodiment of the disclosure, as shown in FIG. 3, when the first dielectric layer 21 covers the recesses and extends to cover the protrusion regions between the recesses, and the thickness of the first conductive region 20 is greater than the depth of the recess, the first doped regions 22 may further extend to the regions between the recesses, specifically, the first doped regions 22 may extend to part of or all of the regions of the protrusions. In this case, the first dielectric layer 21 and the first doped regions 22 disposed on the protrusion regions also form a passivated contact structure, and are communicated with the first dielectric layer 21 and the first doped regions 22 in the recesses, to increase the contact area of the first dielectric layer 21 through which the carriers selectively pass. It should be indicated that when the first doped regions 22 are P-type doped regions, the width of the plurality of recesses of the P-type doped region is set to be 300-600 μm, and when the first doped regions 22 are N-type doped regions, the width of the plurality of recesses of the N-type doped region is set to be 100-500 μm. As a preferable embodiment of the disclosure, the width of the plurality of recesses of the P-type doped region is preferably set to 500 μm, the width of the plurality of recesses of the N-type doped region is preferably set to 300 μm, and the distance between the recesses is preferably 100 m. In view of the above, the width control requirement of dozens of microns for the set recess width is looser as compared with the existing trenches; it would be easier to prepare it as compared with preparing the existing trenches. In addition, it should be further indicated that the widths and depths of the recess in which the first conductive region 20 is disposed and the recess in which the second conductive region 30 is disposed may be set to be identical or different, which depends on actual usage needs and is not specifically limited herein.

Furthermore, in one embodiment of the disclosure, the second conductive region 30 comprises the second doped region, and the second doped region is a doped layer. It should be indicated that the doped layer is different from the first conductive region 20 which is grown in the recess through deposition or the like, and the doped layer is a diffusion structure formed by doping different types of diffusion sources on the silicon substrate 10 at the bottom of the recess. Therefore, the doped layer is not grown inside the recess, instead, the silicon substrate 10 at the bottom of the recess is partially diffused to form the doped layer. Therefore, the doped layer is necessarily located at the bottom of the recess; moreover, the first conductive region 20 is located in the adjacent recess. In this case, the protrusion regions between the recesses can achieve separation between the first conductive regions 20 and the second conductive regions 30 inside different recesses. The second doped region has a junction depth of 0.01-1 µm, a sheet resistance of 10-500 ohm/sqr, and a surface concentration of $1E18-1E21$ $cm^{-3}$. In addition, the second doped region may be a P-type doped layer or an N-type doped layer. The specific conductivity type of the first doped region 22 is set to be opposite to that of the doped layer. The P-type doped layer is formed by diffusion doped with boron, aluminum, gallium or the like, and the N-type doped layer is formed by diffusion doped with nitrogen, phosphorus, arsenic or the like. In this case, the N-type doped layer is an N+ layer with respect to the silicon substrate 10 which is specifically an N-type silicon slice, i.e., the doped layer is formed by partial heavy doping. It should be indicated that when the bottom of the recess is diffused at the diffusion source to form the doped layer, the sidewalls of the recess may also be correspondingly diffused to form the doped layer, so that the doped layer extends to part of regions between the recesses, see FIG. 4 for details. Therefore, in one embodiment of the disclosure, the first doped regions 22 and/or the second doped regions may extend to part of the regions between the recesses. That is, the first doped regions 22 extend out of the recesses to part of the regions between the recesses; or the second doped regions extend from the sidewalls of the recesses to part of the regions between the recesses; or the first doped regions 22 extend out of the recesses to part of the regions between the recesses, and at the same time, the second doped regions extend from the sidewalls of the recesses to part of the regions between the recesses.

Figure 5:
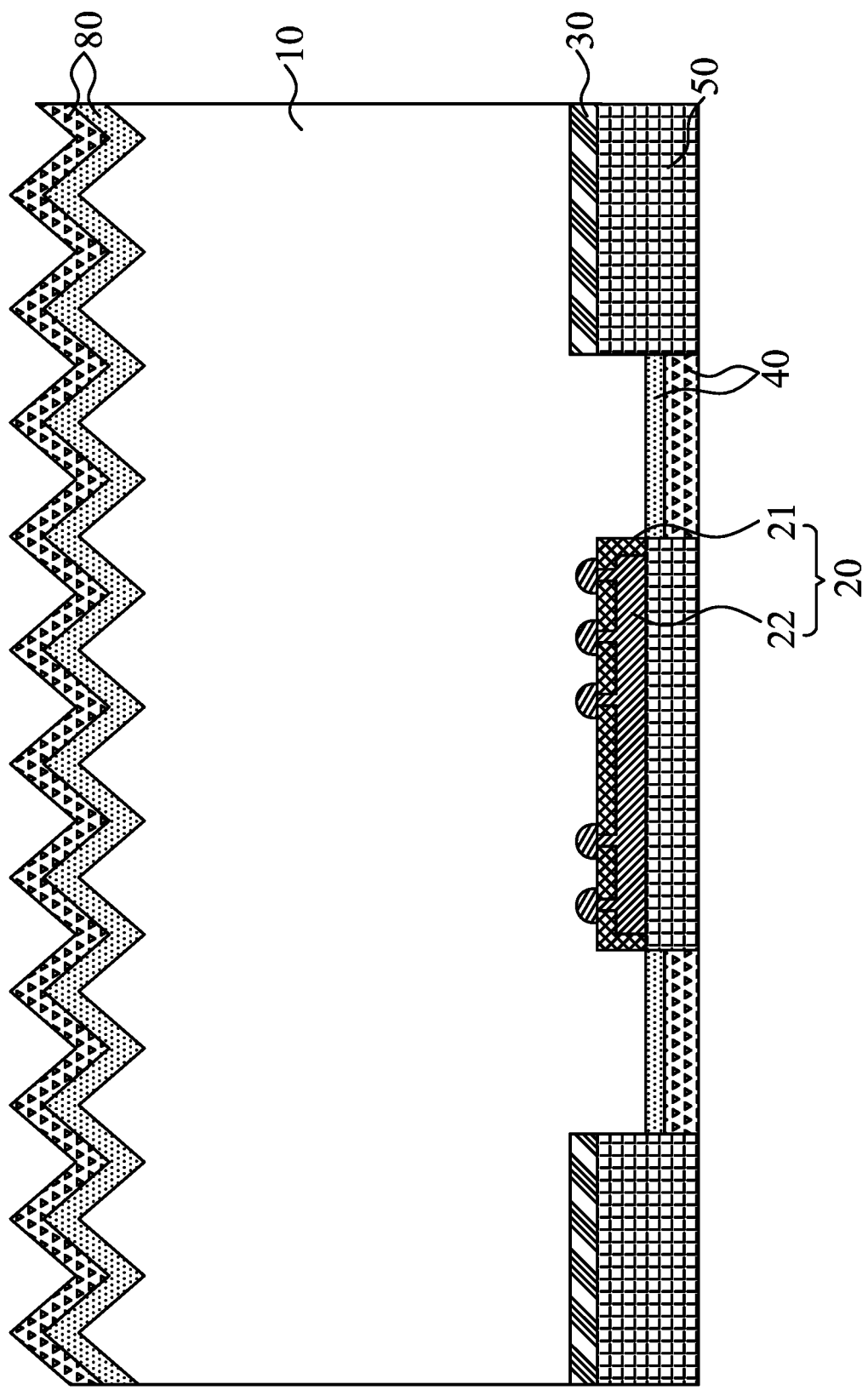
Figure 6:
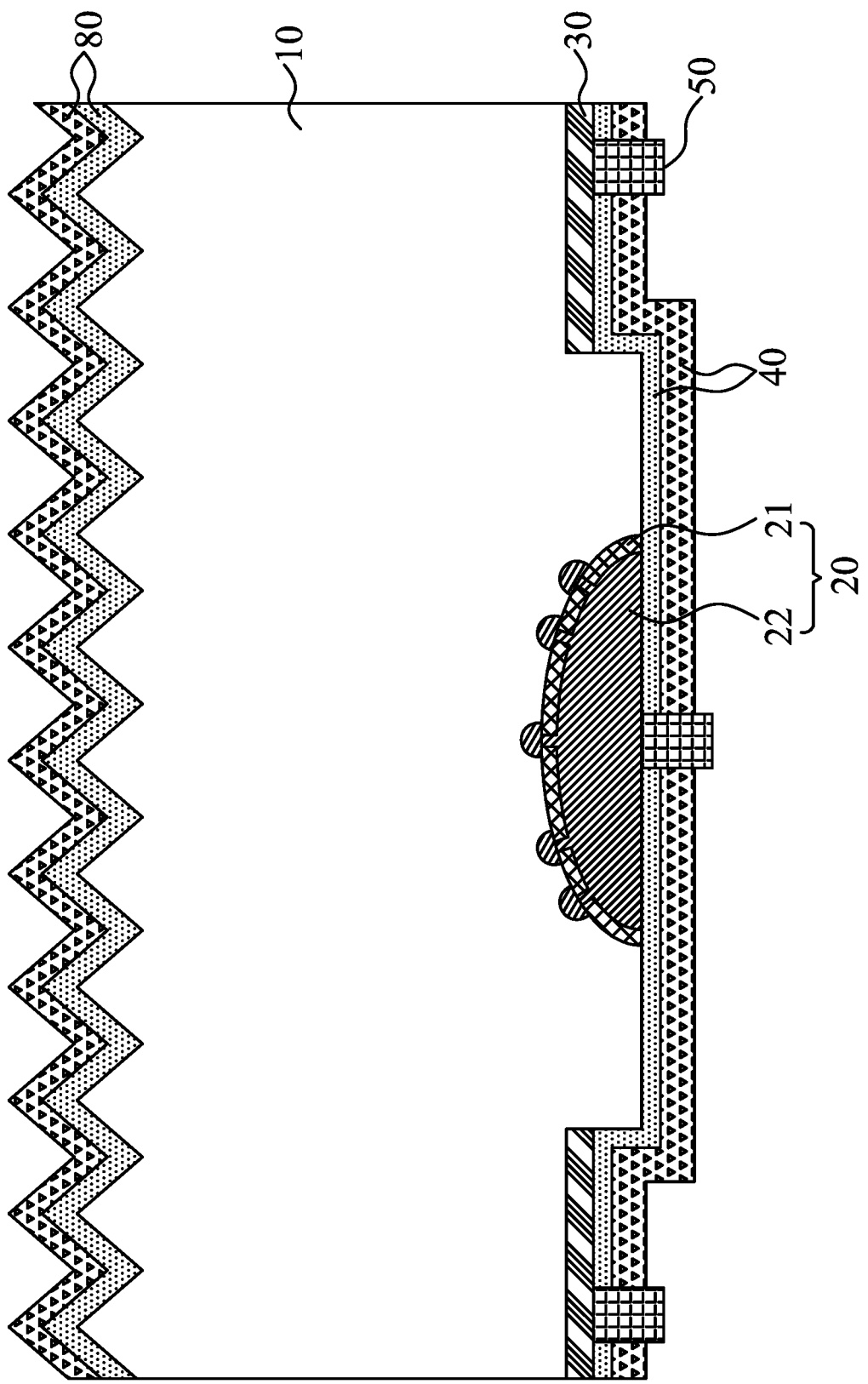

Furthermore, in one embodiment of the disclosure, the second dielectric layer 40 covers regions between the first conductive regions 20 and the second conductive regions 30, or extends to cover the first conductive regions 20 and/or the second conductive regions 30. That is to say, the second dielectric layer 40 may only cover the regions (i.e., the protrusions of the silicon substrate 10) between the first conductive regions 20 and the second conductive regions 30, as shown in FIG. 5; correspondingly, in this case, the conductive layer 50 covers the entire back of the first conductive regions 20 and the second conductive regions 30 for electrical connection. The second dielectric layer 40 may also extend from the protrusions to cover the first conductive regions 20 and/or the second conductive regions 30, see FIG. 1 for details; correspondingly, the second dielectric layer 40 may extend from the protrusions to cover part of regions of the first conductive regions 20, or extend from the protrusions to cover part of regions of the second conductive regions 30, or extend from the protrusions to cover part of the regions of the first conductive regions 20 and the second conductive regions 30, and in this case, the conductive layer 50 covers the remaining part of the back that does not cover the second dielectric layer 40 in the first conductive regions 20 and the second conductive regions 30 to form electrical connections to the first conductive regions 20 and the second conductive regions 30, respectively. Certainly, during the preparing process of the second dielectric layer 40, the entire back of the back contact structure can also be completely covered, and in this case, when preparing the conductive layer 50, the conductive layer 50 penetrates through the second dielectric layer 40 by means of perforation or the like to form electrical connections to the first conductive regions 20 and the second conductive regions 30, respectively.

It should be indicated that when the first dielectric layer 21 merely covers the corresponding recesses, the second dielectric layer 40 is in direct contact with the back surface of the silicon substrate 10 at the protrusions, as shown in FIG. 1. Moreover, when the first dielectric layer 21 covers the corresponding recesses and the regions between the recesses, the second dielectric layer 40 is in contact with the first dielectric layer 21, as shown in FIG. 2.

Furthermore, in one embodiment of the disclosure, the second dielectric layer 40 is preferably selected from one of an aluminum oxide layer, a silicon nitride layer, a silicon oxynitride layer, an intrinsic silicon carbide layer, an intrinsic amorphous silicon layer and a silicon oxide layer, or a combination thereof. The second dielectric layer 40 plays a passivation function and the second dielectric layer 40 is at least set as a one-layer structure; the refractive index of each layer is set to successively decrease outward from the silicon substrate 10, so that the film layer adjacent to the silicon substrate 10 plays a passivation function, while the film layer away from the silicon substrate 10 plays an anti-reflection function, to enhance the anti-reflection effect, thereby increasing the absorption and usage of light by the silicon substrate 10, to increase the short-circuit current density. In addition, the second dielectric layer 40 may further be a doped silicon layer (such as a doped microcrystalline silicon layer, a doped amorphous silicon layer, and a doped polycrystalline silicon layer), a doped silicon carbide layer (such as a doped polycrystalline silicon carbide layer), a doped silicon oxide layer (such as a doped polycrystalline silicon oxide and doped amorphous silicon oxide), etc. In addition, each film layer of a different structure in the second dielectric layer 40 may comprise a plurality of films with different refractive indexes, and according to the fact that the refractive index of each film layer is set to successively decrease outward from the silicon substrate 10, for example, the silicon oxide layer in the second dielectric layer 40 may comprise a plurality of silicon oxide film layers having the refractive index successively decreasing outward from the silicon substrate 10.

As stated above, as some specific examples of the disclosure, for example, the second dielectric layer 40 may be a three-layer structure comprising the silicon oxide layer/ aluminum oxide layer, intrinsic silicon carbide layer, and silicon nitride layer/silicon oxynitride layer; in this case, the thickness of the silicon oxide layer/aluminum oxide layer located at a first layer at an inner side is greater than 0.5 nm, the thickness of the intrinsic silicon carbide layer located at a second layer is greater than 1 nm, and the thickness of the silicon nitride layer/silicon oxynitride layer located at a third layer at an outer side is greater than 50 nm.

As some specific examples of the disclosure, for example, the second dielectric layer 40 may further be a two-layer structure comprising the aluminum oxide layer, and silicon nitride layer/silicon oxynitride layer; in this case, the thickness of the aluminum oxide layer located at a first layer at an inner side is greater than 1 nm, and the thickness of the silicon nitride layer/silicon oxynitride layer located at a second layer at an outer side is greater than 50 nm.

As some specific examples of the disclosure, for example, the second dielectric layer 40 may further be a three-layer structure comprising the silicon oxide layer/aluminum oxide layer, doped polycrystalline silicon layer/doped polycrystalline silicon carbide layer/doped polycrystalline silicon oxide layer, and silicon nitride layer/silicon oxynitride layer; in this case, the thickness of the silicon oxide layer/aluminum oxide layer located at a first layer at an inner side is 0.5-3 nm, the thickness of the doped polycrystalline silicon layer/doped polycrystalline silicon carbide layer/doped polycrystalline silicon oxide layer located at a second layer is 20-100 nm, and the thickness of the silicon nitride layer/silicon oxynitride layer located at a third layer at an outer side is greater than 50 nm.

As some specific examples of the disclosure, for example, the second dielectric layer 40 may further be a three-layer structure comprising the intrinsic amorphous silicon layer, doped amorphous silicon layer/doped amorphous silicon oxide layer, and silicon nitride layer/silicon oxynitride layer; in this case, the thickness of the intrinsic amorphous silicon layer located at a first layer at an inner side is 2-10 nm, the thickness of the doped amorphous silicon layer/doped amorphous silicon oxide layer located at a second layer is 2-50 nm, and the thickness of the silicon nitride layer/silicon oxynitride layer located at a second layer at an outer side is greater than 50 nm.

As some specific examples of the disclosure, for example, the second dielectric layer 40 may further be a three-layer structure comprising the silicon oxide/aluminum oxide layer, intrinsic silicon carbide layer/doped amorphous silicon oxide layer, and silicon nitride layer/silicon oxynitride layer; in this case, the thickness of the silicon oxide/aluminum oxide layer located at a first layer at an inner side is 0.5-3 nm, the thickness of the intrinsic silicon carbide layer/doped amorphous silicon oxide layer located at a second layer is 10-50 nm, and the thickness of the silicon nitride layer/silicon oxynitride layer located at a second layer at an outer side is greater than 50 nm.

As can be understood, the specific structure arrangement of the second dielectric layer 40 comprises, but not limited to, several specific examples listed above. In a preferable embodiment of the invention, as shown in FIG. 1, the second dielectric layer 40 is preferably a two-layer structure of an aluminum oxide layer and an intrinsic silicon carbide layer or a two-layer structure of a silicon oxide layer and an intrinsic silicon carbide layer, and in this case, the overall thickness of the second dielectric layer 40 is greater than 25 nm, where it is normally 70-80 nm during normal production and preparation. In this case, the intrinsic silicon carbide layer not only provides a hydrogen passivation effect, but also reduces parasitic light absorption due to a large optical band gap and a small absorption coefficient with respect to the intrinsic amorphous silicon layer and the doped polycrystalline silicon layer or the like. Furthermore, the thickness of the aluminum oxide layer or the silicon oxide layer in the second dielectric layer 40 is less than 25 nm, and the thickness of the intrinsic silicon carbide layer in the second dielectric layer 40 is greater than 10 nm. It should be indicated that in the multi-layer structure indicated in the embodiment of the disclosure, the order thereof is to arrange outward from the silicon substrate 10. For example, when the second dielectric layer 40 above comprises the aluminum oxide layer and intrinsic silicon carbide layer, the aluminum oxide layer is close to the silicon substrate 10, while the intrinsic silicon carbide layer is close to the outer side. Meanwhile, it should be indicated that in the accompanying drawings of the description, as shown in FIG. 1 to FIG. 9, it is only shown that the second dielectric layer 40 is a two-layer structure; as can be understood, the second dielectric layer 40 may further have other layer number, and the specific structure thereof is set according to actual needs and is not completely as shown in the accompanying drawings of the description. It should be further indicated that each of the accompanying drawings of the description is merely used for describing each specific structure distribution in the back contact structure thereof, but it does not correspond to the actual size dimension of each structure. For example, the thickness of the first dielectric layer 21 above is 1-20 nm, and the thickness of the second dielectric layer 40 is greater than 25 nm; in the accompanying drawings, they do not completely correspond to the specific actual size dimensions in this embodiment, and should depend on the specific parameters provided in this embodiment.

Furthermore, the intrinsic silicon carbide layer in the second dielectric layer 40 comprises at least one first intrinsic silicon carbide film. The refractive indexes of the first intrinsic silicon carbide films successively decrease outward from the back surface of the silicon substrate 10. Optionally, the refractive index of each material is generally selected as: the refractive index of monocrystalline silicon is 3.88; the refractive index of amorphous silicon is 3.5-4.2; the refractive index of polycrystalline silicon is 3.93; the refractive index of silicon carbide is 2-3.88; the refractive index of silicon nitride is 1.9-3.88; the refractive index of silicon oxynitride is 1.45-3.88; the refractive index of silicon oxide is 1.45; and the refractive index of aluminum oxide is 1.63. As can be understood, the refractive index of each material above may further be set as others according to actual usage needs, and is not specifically limited herein.

Furthermore, in one embodiment of the disclosure, a magnesium fluoride layer is disposed at an outer layer of the second dielectric layer 40, i.e., based on the one of an aluminum oxide layer, a silicon nitride layer, a silicon oxynitride layer, an intrinsic silicon carbide layer, an intrinsic amorphous silicon layer and a silicon oxide layer, or a combination thereof selected by the second dielectric layer 40, the magnesium fluoride layer can further be disposed at the outer layer of the second dielectric layer 40. The refractive index requirement for the magnesium fluoride layer is the lowest, and generally, the refractive index thereof is set as 1.4, for enhancing the optical function of anti-reflection.

Figure 7:
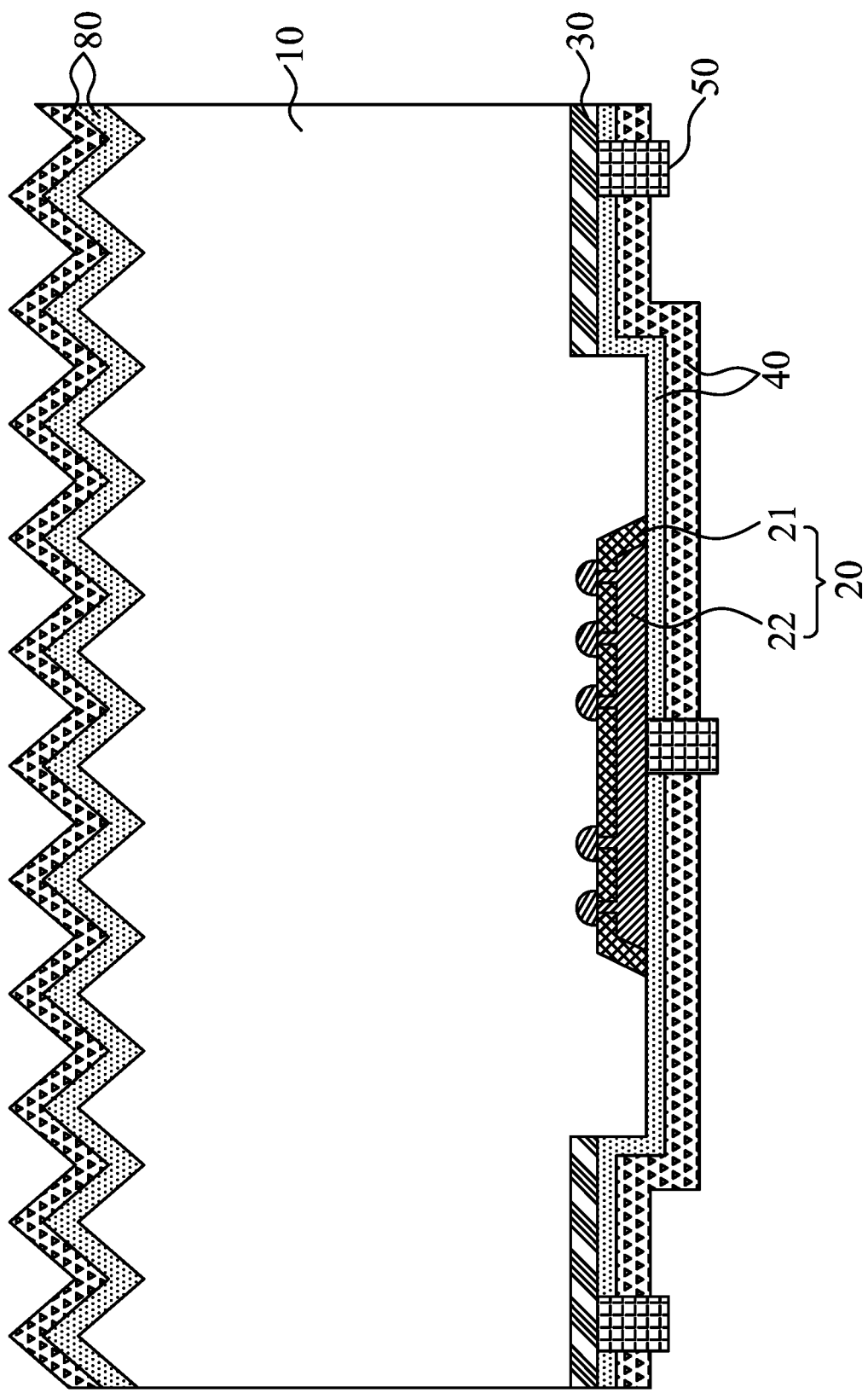

Furthermore, in one embodiment of the disclosure, the conductive layer 50 is a TCO (transparent conductive oxide) film and/or a metal electrode. The metal electrode comprises a silver electrode, a copper electrode, an aluminum electrode, a tin-clad copper electrode, or a silver-clad copper electrode. Furthermore, the copper electrode is electroplated copper prepared through an electroplating process or a copper electrode prepared through physical vapor deposition. The electro-plated copper uses nickel, chromium, titanium, and tungsten electrodes as a seed layer or a protection layer thereof Furthermore, in one embodiment of the disclosure, the plurality of recesses is the shape of an arc, a trapezoid, or a square. It should be indicated that the recesses in which the first conductive regions 20 are disposed and the recesses in which the second conductive regions 30 are disposed may be identical or different. For example, as shown in FIG. 1, in one specific embodiment, all the recesses are square. For another example, as shown in the drawing, in another specific embodiment, the recesses in which the first conductive regions 20 are disposed are arc, while the recesses in which the second conductive regions 30 are disposed are square. For another example, as shown in FIG. 7, in another specific embodiment, the recesses in which the first conductive regions 20 are disposed are trapezoid, while the recesses in which the second conductive regions 30 are disposed are square. The recess is preferably set as an arc or a trapezoid, because when the recess is set as an arc or a trapezoid, an effect of reflecting light by the inner wall of the recess is better, and the corresponding surface area of the first conductive region 20 and the second conductive region 30 in contact with the silicon substrate 10 at the bottom of the recess can be further increased. Certainly, when the recess is set as a square, the actual production process is simpler, and therefore, the recess can be set as a square. The shape of the recess is correspondingly set according to actual usage needs, which is not specifically limited herein.

It should be indicated that, in other embodiments of the disclosure, it is possible that, in a recess in which the first conductive region 20 is disposed, the first dielectric layer 21 is connected to the bottom wall of the recess and the second dielectric layer 40 is further connected to the sidewall of the recess. This is mainly because that the recess region is covered using the mask, and then when the mask is removed in a subsequent process, silicon in part of the silicon substrate 10 near the first conductive region 20 will be corroded to widen the recess; and when the second dielectric layer 40 is deposited in a subsequent process, the second dielectric layer 40 will be deposited in a blank region, so that the second dielectric layer 40 is connected to the sidewall of the recess. Or, when an arc-shaped recess (such as an ellipsoid-shaped recess) is prepared, there may be a case where the first dielectric layer 21 and the first doped region 22 cannot be deposited onto the inner wall of the arc-shaped recess in the long-axis direction, and thus the blank region may be filled with the second dielectric layer 40 during deposition thereof so that the second dielectric layer 40 is connected to the sidewall of the arc-shaped recess, or there may be another case where the second dielectric layer 40 cannot be deposited to the blank region during deposition so that a certain gap is formed between the sidewall of the arc-shaped recess and the first dielectric layer 21 and the first doped region 22. Absolutely, it should be indicated that in the back contact structure of the embodiments of the disclosure, it is preferable that the first dielectric layer 21 is directly connected to the sidewall of the recess, so that the first dielectric layer 21 disposed on the sidewall of the recess can allow selective pass-through of the carriers to achieve multi-dimension collection.

Figure 8:
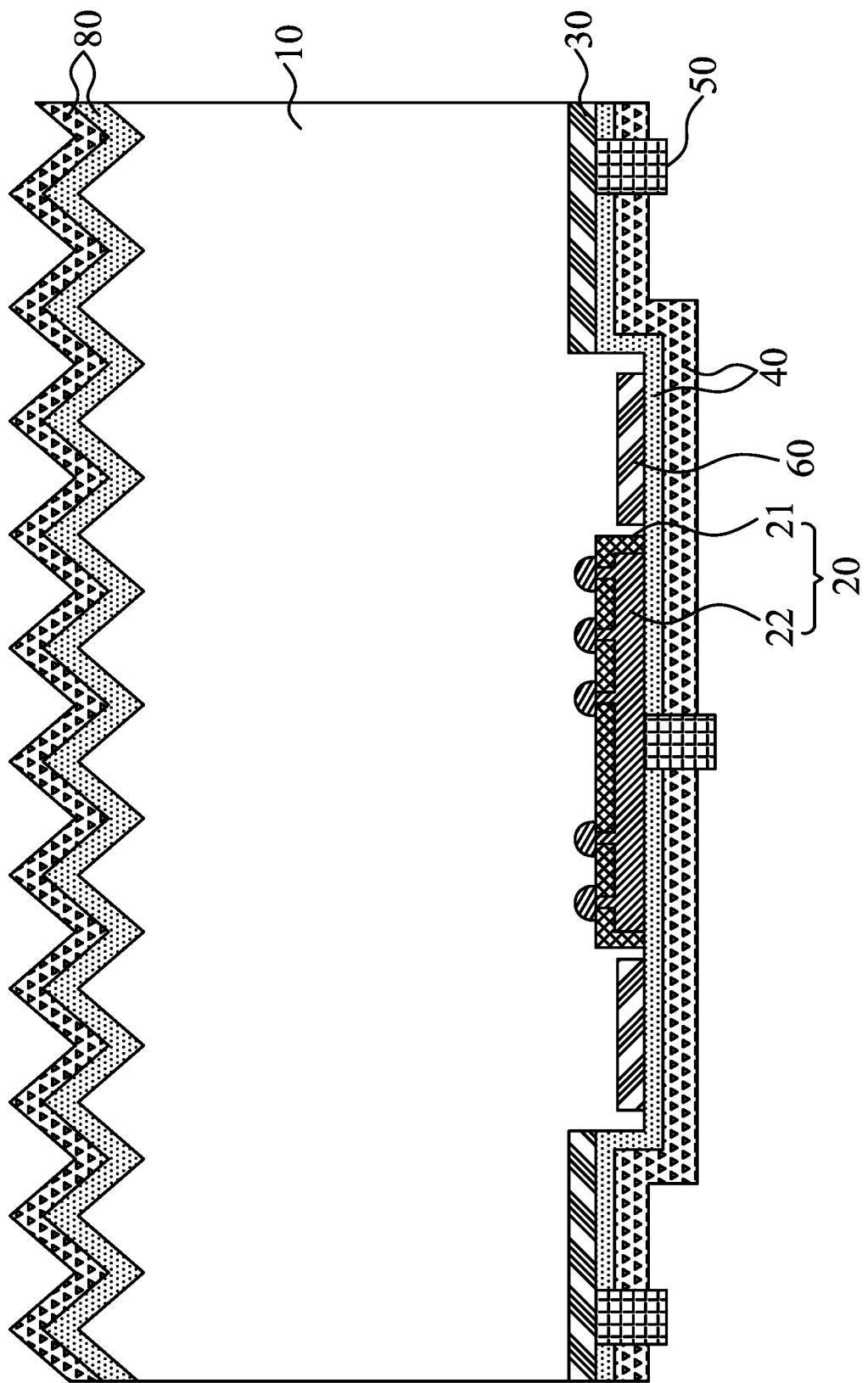

Furthermore, in one embodiment of the disclosure, as shown in FIG. 8, a first doped layer 60 having the same conductivity type as the first doped region 22 is disposed in the silicon substrate 10 located on regions between the first conductive regions 20 and the second conductive regions 30. That is to say, the first doped layer 60 is disposed on each protrusion of the silicon substrate 10, where the first doped layer 60 may be disposed on the entire protrusion and may also be disposed on part of the regions of the protrusions. The first doped layer 60 may be a P-type diffusion layer or an N-type diffusion layer, which is determined according to the conductivity type of the first doped region 22, for example, when the first doped region 22 is the P-type doped region, the first doped layer 60 is the P-type diffusion layer. In this case, since the first dielectric layer 21 is disposed on the sidewalls of the recesses and the part of the silicon substrate 10 located at the position of the protrusion is diffused to form the first doped layer 60, it would be easier for the carriers in the first doped layer 60 to selectively pass through the first dielectric layer 21 on the sidewall of the adjacent recess to be separated and collected into the corresponding first doped region 22.

Figure 9:
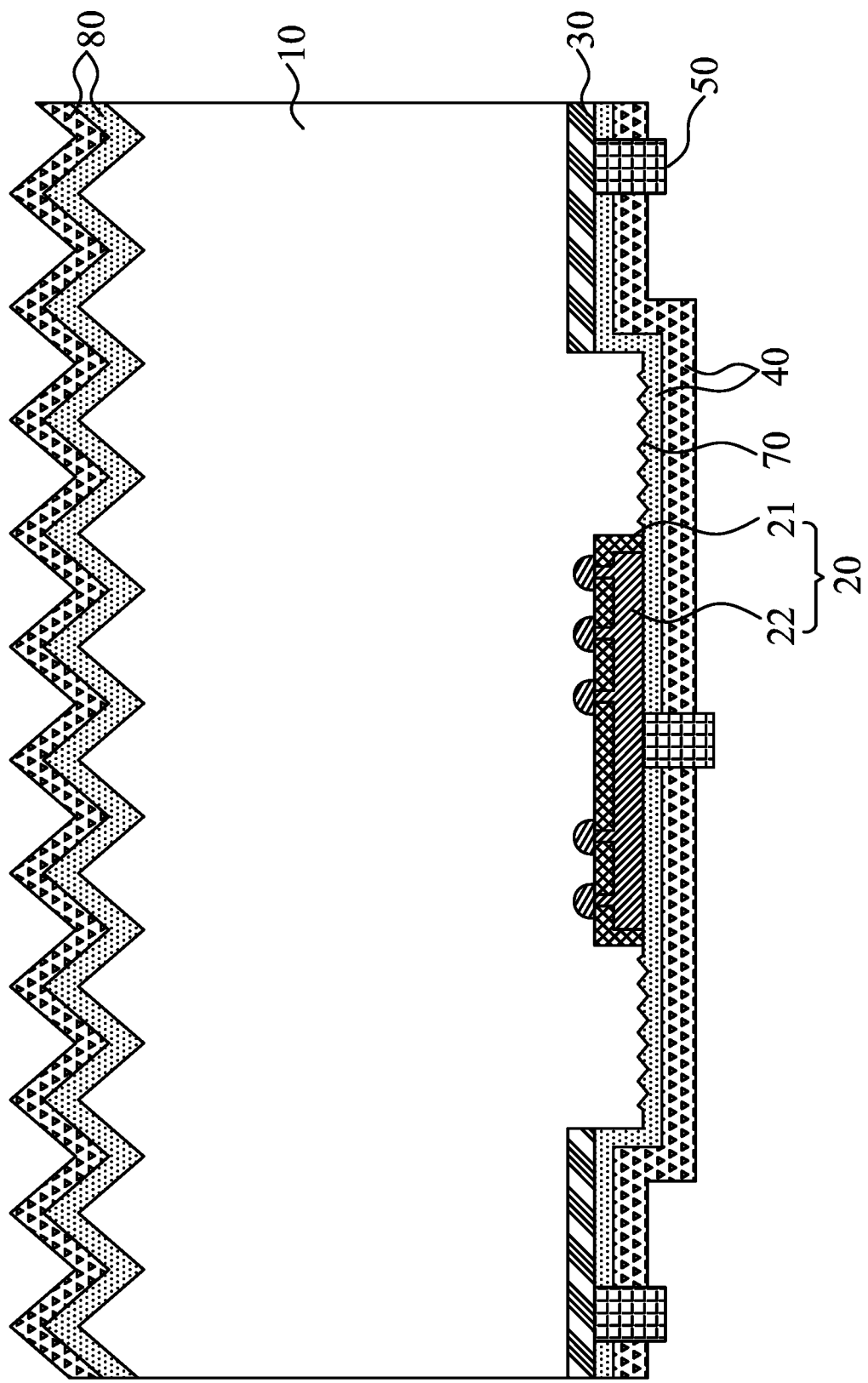

Furthermore, in one embodiment of the disclosure, as shown in FIG. 9, a back surface of the silicon substrate 10 located on regions between the first conductive regions 20 and the second conductive regions 30 comprises a rough texture structure 70. That is to say, the protrusion surface of the silicon substrate 10 has the rough texture structure 70, where when the first dielectric layer 21 merely covers the corresponding recesses, the rough texture structure 70 is located at a position where the second dielectric layer 40 is in contact with the back surface of the silicon substrate 10; and when the first dielectric layer 21 covers the corresponding recesses and the regions between the recesses, the rough texture structure 70 is located at a position where the first dielectric layer 21 is in contact with the back surface of the silicon substrate 10. The rough texture structure 70 is generally made through texturing, comprising forming hemispherical textures through acid texturing and forming pyramid-shaped textures through alkaline texturing, or forming pyramid-shaped textures through alkaline texturing and then performing rounding treatment on pyramid apexes through acid texturing. It should be understood that the rough texture structure 70 may also be disposed on the entire back surface of the silicon substrate 10, that is, the silicon substrate 10 inside the recesses also has the rough texture structure 70. In this case, the entire back surface of the silicon substrate 10 on which the recesses are formed is directly textured, without the subsequent process of removing the rough texture structure 70 in the recesses, so that the process is simplified. However, it should be indicated that in this embodiment, it is preferable that texturing is only performed on the protrusion surface of the silicon substrate 10, to increase the reflection of the incident light inside the silicon substrate 10 to increase the absorption rate of light, while texturing is not performed on the inner surface of the recess. In this case, after the entire back surface of the silicon substrate 10 on which the recesses are formed is directly textured, the rough texture structure 70 in the recesses are removed through laser.

By tests, with respect to a cell prepared in an existing groove manner in the control group, the cell conversion efficiency of the cell prepared from the back contact structure provided in the embodiments of the disclosure in the experiment group can be effectively improved to about 25.7% and the reliability is greatly improved. Electrical performance results are shown in Table 1 below:

TABLE 1

| Name | UOC | JSC | FF | EF |
| --- | --- | --- | --- | --- |
| Experiment group | 728 | 41.8 | 84.4% | 25.7% |
| Control group | 720 | 41.6 | 84.3% | 25.2% |

The embodiment of the disclosure has the following beneficial effects with respect to the related art:

1. The recesses are disposed at intervals on the back surface of the silicon substrate, and the first conductive regions and the second conductive regions are disposed alternately in the recesses, so that separation between the first conductive regions and the second conductive regions inside the recesses is implemented through a protrusion structure between the recesses of the silicon substrate; moreover, the recesses disposed have a lower width control requirement than existing trenches, and preparation of the recesses is easier than preparation of the existing trenches; moreover, when depositing the first dielectric layer and the first doped regions inside the recesses, the deposition effect thereof is better. In addition, a first conductive region having the first dielectric layer and the first doped region is disposed in one recess, and a second conductive region having a second doped region is disposed in another adjacent recess, so that technological processes can be reduced in preparation steps and the cost is lowered.

2. Since the arrangement of the recesses enables the first dielectric layer to be in contact with both bottom walls and sidewalls of the recesses, the carriers generated on the silicon substrate would also be easily separated through the first dielectric layer on the sidewalls of the recesses and selectively collected into the corresponding first doped regions, so that leakage current can be reduced and selective transport of the carriers in longitudinal and transverse directions can also be implemented, thereby facilitating multi-dimensional collection of the carriers on the bottom walls and sidewalls of the recesses.

3. Since the second dielectric layer disposed is at least one in number, passivation is performed on the back surface of the silicon substrate through the second dielectric layer having at least one layer and the first dielectric layer to bring a better passivation effect; and by controlling the refractive index of each layer to successively decrease outward from the silicon substrate, the inner back reflection of light in the long wave band at the silicon substrate can be improved, to increase a short-circuit current density.

4. A recess has a specific depth, and the hard mask is only in direct contact with the protrusion portion between two recesses so that the hard mask will not be in direct contact with the bottom of the recess to reduce impurity contamination, so that the hard mask yields a certain protection effect on the silicon substrate on the bottom wall of the recess, there is no need to worry that the hard mask will cause damage to the silicon substrate, and the damage caused by contact of the hard mask with the surface of the protrusion of the silicon substrate can also be eliminated in the subsequent texturing process.

5. In the process that the hard mask is used to selectively deposit the first doped regions, since the recesses are separated by the silicon substrate protrusion structure having a specific width, when the hard mask is used for covering one recess and performing deposition in another adjacent recess region, accurate alignment of the hard mask is not required and a moderate amount of deviation is allowed, so that the alignment of the hard mask gets simpler and then the technological difficulty is reduced.

6. In the related art, due to width and depth limitations to a groove region, a chemical solution cannot completely infiltrate the bottom of the groove for chemical wet texturing due to hydrophobicity of water and a silicon slice. However, in this embodiment, since the recesses are disposed and the back surface of the silicon substrate between adjacent recesses is the protrusion, it would be easier to obtain the rough texture structure by texturing than existing groove structures; moreover, reflection of light on the inner back surface of the silicon substrate is enhanced after the protrusions on the back surface of the silicon substrate are textured, thereby increasing the light absorption rate of the silicon substrate.

7. Since the first doped layers are disposed on regions between the recesses in the silicon substrate, it would be easier for the carriers in the first doped layer to selectively pass through the first dielectric layer on the sidewall of the adjacent recess to be separated and collected into the corresponding first doped region.

Embodiment 2

The second embodiment of the disclosure provides a selective contact region buried solar cell. To facilitate explanation, merely the parts related to the embodiment of the disclosure are illustrated. With reference to FIG. 1 to FIG. 9, the selective contact region buried solar cell provided by the embodiment of the disclosure comprises:

a silicon substrate 10;

the back contact structure disposed on a back surface of the silicon substrate 10 as stated in the foregoing embodiment; and a third dielectric layer 80 disposed on a front surface of the silicon substrate 10.

Furthermore, in one embodiment of the disclosure, the second dielectric layer 40 and the third dielectric layer 80 may be respectively prepared on the front and back surface of the silicon substrate 10 through a same process. In this case, the third dielectric layer 80 may have the same structure as the second dielectric layer 40 in the foregoing embodiment. Therefore, with reference to the foregoing embodiment, preferably, the third dielectric layer 80 may also be selected from one of an aluminum oxide layer, a silicon nitride layer, a silicon oxynitride layer, an intrinsic silicon carbide layer, an intrinsic amorphous silicon layer and a silicon oxide layer, or a combination thereof.

As some examples of the disclosure, the third dielectric layer 80 may further have a three-layer structure comprising the silicon oxide layer/aluminum oxide layer and the doped polycrystalline silicon layer/doped polycrystalline silicon carbide layer/doped polycrystalline silicon oxide layer and the silicon nitride layer/silicon oxynitride layer, or a three-layer structure comprising the intrinsic amorphous silicon layer and the doped amorphous silicon layer/doped amorphous silicon oxide layer and the silicon nitride layer/silicon oxynitride layer, or a three-layer structure comprising the silicon oxide layer/aluminum oxide layer and the silicon carbide layer/doped amorphous silicon oxide layer and the silicon nitride layer/silicon oxynitride layer.

Furthermore, in one preferable embodiment of the disclosure, with reference to FIG. 1, preferably, the third dielectric layer 80 also correspondingly has a two-layer structure comprising the silicon oxide layer and the silicon carbide layer, or a two-layer structure comprising the aluminum oxide layer and the silicon carbide layer, and the thickness of the third dielectric layer 80 is greater than 50 nm. In this case, the silicon carbide layer not only provides a hydrogen passivation effect, but also reduces parasitic light absorption due to a large optical band gap and a small absorption coefficient with respect to the intrinsic amorphous silicon layer and the doped polycrystalline silicon layer or the like. The thickness of the aluminum oxide layer or the silicon oxide layer in the third dielectric layer 80 is less than 40 nm, and the thickness of the silicon carbide layer in the third dielectric layer 80 is greater than 10 nm. Furthermore, the silicon carbide layer in the third dielectric layer 80 comprises at least one silicon carbide film. The refractive indexes of the silicon carbide films successively decrease outward from the front surface of the silicon substrate 10. Furthermore, in one embodiment of the disclosure, a magnesium fluoride layer is disposed at an outer layer of the third dielectric layer 80. The refractive index requirement for the magnesium fluoride layer at the outermost layer is the lowest, and generally, the refractive index is set as 1.4, for enhancing the optical function of antireflection.

Certainly, the third dielectric layer 80 may have a different structural arrangement from the second dielectric layer 40 in the foregoing embodiment, and the film structures of the second dielectric layer 40 and the third dielectric layer 80 are correspondingly set depending on actual usage needs, which is not specifically limited herein.

Furthermore, in one embodiment of the disclosure, an electric field layer or a floating junction is disposed between the front surface of the silicon substrate 10 and the third dielectric layer 80, specifically comprising performing phosphorus diffusion on the silicon substrate 10 to obtain the electric field layer or performing boron diffusion to obtain the floating junction. In this case, the electric field layer or the floating junction serves as a Front-Surface Field (FSF) of the selective contact region buried solar cell.

In this embodiment, recesses are disposed at intervals on a back of a silicon substrate, and first conductive regions and second conductive regions are disposed alternately inside the recesses, so that separation between the first conductive regions and the second conductive regions inside the recesses is implemented through a protrusion structure between the recesses of the silicon substrate; moreover, the recesses disposed have a lower width control requirement than existing trenches, and preparation of the recesses is easier than preparation of the existing trenches. Further, when a first dielectric layer and first doped regions are deposited inside the recesses, the deposition effect is better. In addition, a first conductive region having the first dielectric layer and the first doped region is disposed in one recess, and a second conductive region having a second doped region is disposed in another adjacent recess, so that technological processes can be reduced in preparation steps and the cost is lowered. In addition, since the arrangement of the recesses enables the first dielectric layer to be in contact with both bottom walls and sidewalls of the recesses, the carriers generated on the silicon substrate would also be easily separated through the first dielectric layer on the sidewalls of the recesses and selectively collected into the corresponding first doped regions, so that leakage current can be reduced and selective transport of the carriers in longitudinal and transverse directions can also be implemented, thereby facilitating multi-dimensional collection of the carriers on the bottom walls and sidewalls of the recesses. Since a second dielectric layer disposed is at least one in number, multi-layer passivation is achieved on the back surface of the silicon substrate through the second dielectric layer having at least one layer, and inner back reflection is enhanced, thereby yielding a better passivation effect and a better inner back reflection effect and solving the existing problems of a high groove width control requirement and a poor passivation effect.

Embodiment 3

Figure 10:
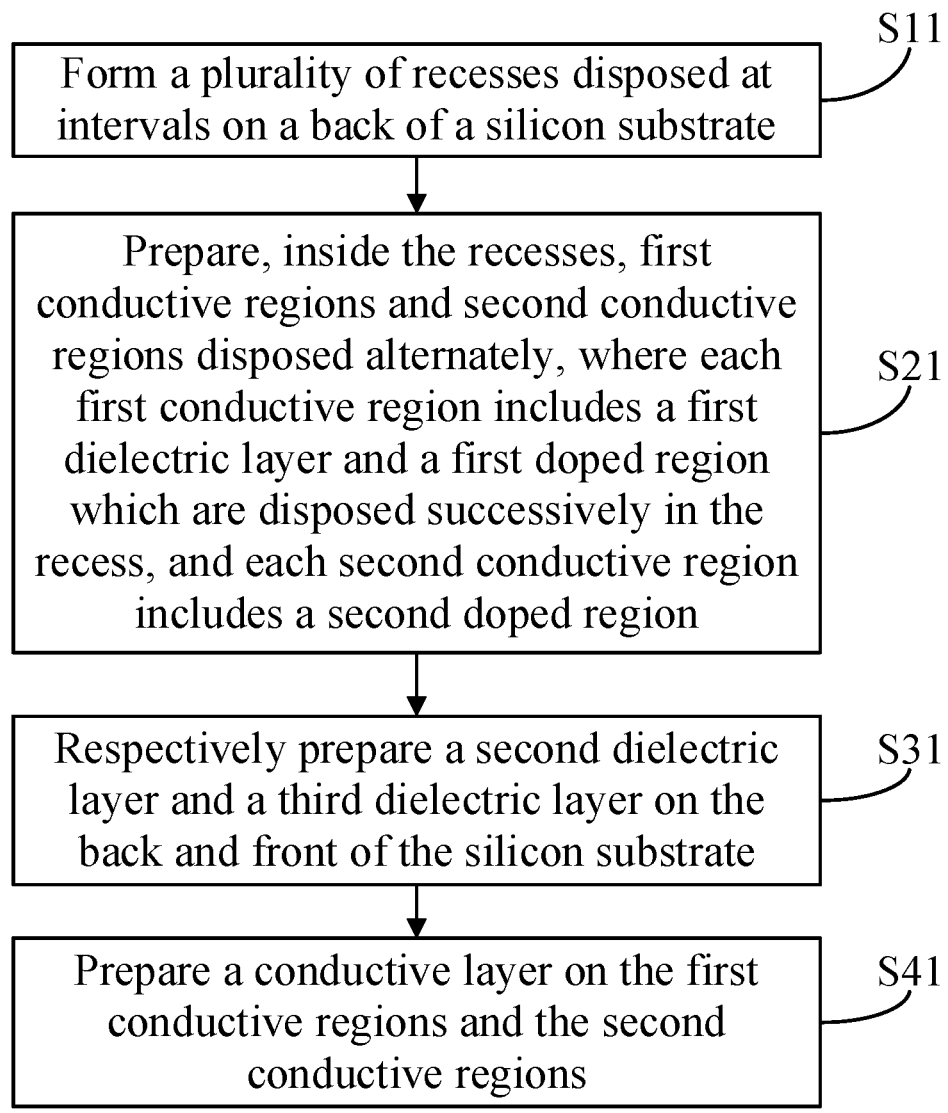
FIG. 10 is a flow chart of a selective contact region buried solar cell manufacturing method provided by another embodiment of the disclosure.

The third embodiment of the disclosure provides a selective contact region buried solar cell manufacturing method. To facilitate explanation, merely the parts related to the embodiment of the disclosure are illustrated. With reference to FIG. 10, the selective contact region buried solar cell manufacturing method provided by the embodiment of the disclosure is used for preparing the selective contact region buried solar cell as stated in the preceding embodiment, and specifically, the method comprises the following steps.

At step S11, a plurality of recesses is formed at intervals on a back of a silicon substrate.

Before step S11, it should further comprise pre-treating the silicon substrate.

The pre-treatment above comprises cleaning the silicon substrate and removing a damaged layer. Specifically, the pre-treatment comprises:

(1) performing RCA standard cleaning to remove particles, organic matters, or the like on the surface of the silicon substrate;

(2) placing the cleaned silicon substrate in a 2-5% potassium hydroxide (KOH) solution or tetramethylammonium hydroxide (TMAH) solution (i.e., a developing solution) for treatment at a temperature of 50-80° C. for 1-5 min, to remove a surface damaged layer caused in a slicing process;

(3) performing pickling on the surface of the silicon substrate using HCl, to neutralize the alkaline solution left on the surface of the silicon substrate and remove metal impurities left on the surface of the silicon slice; and (4) cleaning the silicon substrate using an HF solution, to remove a silicon oxide layer on the surface of the silicon slice and form a Si—H passivation bond with a dangling bond on the surface of the silicon substrate, and finally, performing drying using nitrogen for use.

Furthermore, after the silicon substrate is pre-treated, the recesses may be formed in the following ways:

way I: the part where the recesses need to be disposed at intervals is directly slotted through laser and partial silicon crystal is removed from the back surface of the silicon substrate, to form the desired recesses; way II: the silicon substrate is subjected to thermal oxidation treatment so that a silicon oxide layer is formed on the entire surface of the silicon substrate, silicon oxide in part of the regions on the front and back surface of the silicon substrate is removed through laser slotting, and then silicon oxide is removed using an acid (such as HF) through wet etching, to form the desired recesses; way III: a silicon nitride layer is deposited on the back surface of the silicon substrate through PECVD, silicon nitride in part of the region on the back is removed through laser slotting, and then silicon nitride is removed through wet etching, to form the desired recesses; way IV, silicon nitride is deposited on the back surface of the silicon substrate or the silicon substrate is subjected to thermal oxidation treatment to form silicon oxide, a photoresist mask is then deposited on the back, developing is enabled on a developing region through exposure using a patterned screen, the developing region is removed with a wet method using a developing agent, silicon nitride/silicon oxide in the developing region is removed using an acid (such as HF), and the photoresist mask and silicon nitride/silicon oxide are removed through wet etching, to form the desired recesses; and way V: a patterned paste is printed on the back surface of the silicon substrate as a mask, and the paste is then removed through wet etching, to form the desired recesses.

In the embodiment of the disclosure, way II is preferably used for forming the recesses, where in way II, the thermal oxidation treatment step specifically comprises: performing dry-oxygen oxidation/steam oxidation/wet-oxygen oxidation (i.e., dry-oxygen+steam) in a quartz tube, where specific reactants comprise oxygen and/or high-purity steam, the reaction pressure is 50-1000 mbar, the reaction temperature is 900-1200° C., and the thickness of silicon oxide prepared from the reaction is greater than 10 nm. The step of removing silicon oxide through laser slotting specifically comprises: removing silicon oxide to be removed through slotting by laser having a laser wavelength of 532 nm, a laser power of 10-60 W, a laser frequency less than or equal to 250-1500 KHz, and a laser pulse width of 3-50 ns. An alkaline solution and isopropyl acetone are used in the wet etching step, where the alkaline solution is KOH or TMAH, the concentration of the alkaline solution is 1-5%, the content of isopropyl acetone is 1-10%, the reaction temperature is 60-85° C., and the reaction time is 10-30 min. An acidic solution in the step of removing silicon oxide using the acid is HF, where the concentration of the acidic solution is 1-5%, the reaction temperature is room temperature, and the reaction time is 3-10 min.

Specifically, after the recess is formed through way II, the depth of the formed recess is 0.01-10 μm, and the distance between the recesses is 20-500 m. The formed recess may be an arc, a trapezoid, or a square. Since trenches used in the related art are prepared by laser perforation or wet etching, the width control requirement for the trenches is high and it is difficult to prepare. However, preparation of the recesses in this embodiment is easier than preparation of existing trenches, and does not have a strict width control requirement as the existing trenches.

At step S21, first conductive regions and second conductive regions disposed alternately are prepared inside the recesses, where each first conductive region comprises a first dielectric layer and a first doped region which are disposed successively in the recess, and each second conductive region comprises a second doped region.

Before step S21, the specific production process may further comprise texturing the front surface of the silicon substrate. In this embodiment, texturing on the front is mainly achieved by corrosion using an alkaline solution, where the alkaline solution reacts with the silicon substrate to generate a water-soluble compound, and a pyramid-shaped textured structure is formed on the surface. In this case, due to the existence of the textured structure, after incident light is reflected by the textured surface for the first time, reflected light does not directly enter the air, but enters the air after encountering the adjacent textured surface and being reflected by the textured surface for the second time or even for the third time. Therefore, the incident light is used for multiple times, thereby reducing the reflectivity of the front. When the back surface of the silicon substrate also needs to have a rough texture structure, the front and back surface of the silicon substrate can be textured at the same time; and when the back surface of the silicon substrate does not need to have a rough texture structure, a silicon nitride protection layer is deposited on the back surface of the silicon substrate, the front is then textured, and the silicon nitride protection layer is removed from the back through laser, thereby avoiding texturing on the back surface of the silicon substrate.

The preparing, inside the recesses, first conductive regions and second conductive regions disposed alternately is implemented in the following steps:

successively preparing the first dielectric layer and the first doped region having a first conductivity type inside a first recess; and preparing the second doped region having a second conductivity type inside a second recess adjacent to the first recess, where the first conductivity type is opposite to the second conductivity type.

It should be indicated that the first doped region and the second doped region have opposite conductivity types, where if the first doped region is a P-type doped region, the second doped region is correspondingly an N-type doped layer; or if the first doped region is an N-type doped region, the second doped region is correspondingly a P-type doped layer.

Since the step of preparing, inside the recesses, the first conductive regions and the second conductive regions disposed alternately cannot be implemented at the same time through a technological process, the first conductive regions are prepared before the preparation of the second conductive regions, or the second conductive regions are prepared before the preparation of the first conductive regions. Accordingly, the order of preparing the first conductive regions and the second conductive regions is set in consideration of the convenience of an actual technological process, which is not specifically limited herein. Preferably, in this embodiment, the first conductive regions are prepared in the first recesses for disposing the first conductive regions, and then the second conductive regions are prepared in the adjacent second recesses for preparing the second conductive regions.

Furthermore, the successively preparing the first dielectric layer and the first doped region having a first conductivity type inside a first recess specifically refers to preparing the first dielectric layer inside the first recess and then performing in-situ deposition or ex-situ deposition on the first dielectric layer to prepare the first doped region having the first conductivity type, where it should be indicated that since deposition inside a specific recess cannot be implemented separately during technological manufacturing, the preparing, inside the recesses, the first conductive regions and the second conductive regions disposed alternately may specifically refer to preparing the first dielectric layer and the first doped regions successively on the back surface of the silicon substrate, removing the first dielectric layer and the first doped regions in the second recesses through laser or the like, and preparing the second doped regions inside the second recesses.

Specifically, the first dielectric layer is prepared inside the first recess according to a high-temperature oxidation process, a deposition process or the like, which is set depending on the type of the first dielectric layer to be specifically deposited and is not specifically limited therein. In this case, the first dielectric layer is one of a tunneling oxide layer, an intrinsic silicon carbide layer and an intrinsic amorphous silicon layer, or a combination thereof, and the thickness of the first dielectric layer is 1-20 nm. In this case, the first dielectric layer covers the entire back surface of the silicon substrate. Therefore, it is required to remove the first dielectric layer in the second recess through laser or the like, and if it is also required to remove the first dielectric layer disposed on the protrusion region between the first recess and the second recess, the first dielectric layer covering the protrusion of the silicon substrate can be further removed through laser or the like.

Specifically, in one embodiment of the disclosure, when in-situ deposition is used for the prepared first doped region, the step of preparing the first doped region on the first dielectric layer comprises:

depositing the first conductivity type of doped amorphous silicon or doped amorphous silicon carbide on the first dielectric layer; and performing high-temperature crystallization treatment, so that the doped amorphous silicon or the doped amorphous silicon carbide is changed into doped polycrystalline silicon or doped silicon carbide to obtain the first doped region having the first conductivity type.

In a feasible solution, when in-situ deposition of, for example, the P-type doped region, is performed inside the first recess, the second recess in which deposition is not needed is shielded with a mask method. In this case, in-situ deposition of P-type amorphous silicon/P-type amorphous silicon carbide is performed inside the first recess, and then the temperature is increased to 700-1000° C. directly using a high-temperature or laser heating method. Therefore, after high-temperature crystallization treatment, the P-type amorphous silicon/P-type amorphous silicon carbide in the first recess is changed into P-type polycrystalline silicon/P-type silicon carbide, to obtain the P-type doped region, i.e., the first doped region having the first conductivity type. It should be correspondingly indicated that the recess has a specific depth, the mask is positioned against the protrusion and thus will not directly contact the bottom of the shielded second recess, so that impurity contamination at the bottom of the second recess can be reduced.

The mask may be a hard mask, a silicon nitride mask, a silicon oxide mask, and a photoresist mask.

Specifically, in one embodiment of the disclosure, when ex-situ deposition is used for the prepared first doped region, the step of preparing the first doped region on the first dielectric layer comprises:

depositing intrinsic amorphous silicon or intrinsic silicon carbide on the first dielectric layer; and performing the first conductivity type of doping on the intrinsic amorphous silicon or the intrinsic silicon carbide; and performing high-temperature crystallization treatment, so that the intrinsic amorphous silicon or the intrinsic silicon carbide is changed into doped polycrystalline silicon or doped silicon carbide to obtain the first doped region having the first conductivity type.

The step of performing the first conductivity type of doping on the intrinsic amorphous silicon or the intrinsic silicon carbide specifically comprises:

injecting the first conductivity type of ions onto the intrinsic amorphous silicon or the intrinsic silicon carbide for doping; or depositing the first conductivity type of doping sources on the intrinsic amorphous silicon or the intrinsic silicon carbide for doping; or introducing the first conductivity type of source gas onto the intrinsic amorphous silicon or the intrinsic silicon carbide for doping.

In a feasible solution, specifically, intrinsic amorphous silicon or intrinsic silicon carbide is deposited on the first dielectric layer; then the first conductivity type of ions are injected onto the intrinsic amorphous silicon or intrinsic silicon carbide for doping (when the first doped region is the P-type doped region, P-type ions containing elements boron, aluminum, gallium or the like are injected, and when the first doped region is the N-type doped region, N-type ions containing elements nitrogen, phosphorus, arsenic or the like are injected), or the first conductivity type of doping source is deposited, with a mask method, onto the intrinsic amorphous silicon or intrinsic silicon carbide for doping (when the first doped region is the P-type doped region, a P-type doping source containing boron, aluminum, gallium or the like (such asborosilicate glass) is deposited for doping to form P-type amorphous silicon/P-type silicon carbide, and when the first doped region is the N-type doped region, an N-type doping source containing nitrogen, phosphorus, arsenic or the like (such as phosphosilicate glass) is deposited for doping to form N-type amorphous silicon/N-type silicon carbide), or the first conductivity type of source gas is introduced, with a mask method, onto the intrinsic amorphous silicon or intrinsic silicon carbide for doping (when the first doped region is the P-type doped region, a P-type source gas containing elements boron, aluminum, gallium or the like (such as a borane gas or a carrier gas carrying boron trichloride or boron tribromide) is introduced for doping to form P-type amorphous silicon/P-type silicon carbide, and when the first doped region is the N-type doped region, an N-type source gas containing nitrogen, phosphorus, arsenic or the like (such as a phosphorane gas or a carrier gas carrying phosphorus oxychloride) is introduced for doping to form N-type amorphous silicon/N-type silicon carbide); and further, after the doping is completed, high-temperature crystallization treatment is performed so that the original intrinsic amorphous silicon or intrinsic silicon carbide is changed into doped polycrystalline silicon or doped silicon carbide, to obtain the first doped region having the first conductivity type. Since in deposition with intrinsic amorphous silicon/intrinsic silicon carbide, deposition may be performed on the sides and front surface of the silicon substrate, after high-temperature crystallization, it is required to add wet etching treatment to achieve bypass plating. In addition, it should be indicated that after the first conductivity type of doping source is deposited for doping and after high-temperature crystallization treatment is completed, it is also required to remove the doping source through laser or the like.

Specifically, in another embodiment of the disclosure, when ex-situ deposition is used for the prepared first doped region, the step of preparing the first doped region on the first dielectric layer further comprises:

depositing intrinsic amorphous silicon or intrinsic silicon carbide on the first dielectric layer; and performing the first conductivity type of diffusion on the intrinsic amorphous silicon or the intrinsic silicon carbide, so that the intrinsic amorphous silicon or the intrinsic silicon carbide is changed into doped polycrystalline silicon or doped silicon carbide to obtain the first doped region having the first conductivity type.

It should be indicated that in the process of preparing the first doped regions, since the high-temperature crystallization process is needed, the thin first dielectric layer may be partially broken. In this case, in the high-temperature diffusion process, attachment may occur at the broken part of the first dielectric layer and the back surface of the silicon substrate, and then a plurality of inner diffusion regions corresponding to the first doped regions are formed on the surface of the silicon substrate in contact with the first dielectric layer.

Furthermore, the step of preparing the second doped region having a second conductivity type in a second recess adjacent to the first recess comprises:

introducing a source gas corresponding to the second conductivity type for thermal diffusion inside the second recess to form the second doped region having the second conductivity type; or depositing or spin-coating a doping source corresponding to the second conductivity type for thermal diffusion inside the second recess to form the second doped region having the second conductivity type; or injecting ions corresponding to the second conductivity type for thermal diffusion inside the second recess to form the second doped region having the second conductivity type.

Specifically, when the second doped region is the P-type diffusion layer, the specific preparation process comprises: way I: introducing a source gas containing elements boron, aluminum, gallium or the like (such as a borane gas or a carrier gas carrying boron trichloride or boron tribromide) for thermal diffusion to form the P-type doped layer; way II: depositing a doping source containing boron, aluminum, gallium or the like (such as borosilicate glass) for thermal diffusion to form the P-type doped layer; way III: preparing an aluminum electrode above the doped layer and forming the P-type doped layer doped with aluminum in a high-temperature process; way IV: spin-coating a doping source containing boron, aluminum, gallium or the like (such as boron tribromide) for thermal diffusion to form the P-type doped layer; and way V: injecting ions containing elements boron, aluminum, gallium or the like and performing high-temperature diffusion to form the P-type doped layer.

When the second doped region is the N-type doped layer, the specific preparation process comprises: way I: introducing a source gas containing elements such as nitrogen, phosphorus, arsenic or the like (such as a phosphorane gas or a carrier gas carrying phosphorus oxychloride) for thermal diffusion to form the N-type doped layer; way II: depositing a doping source containing nitrogen, phosphorus, arsenic or the like (such as phosphosilicate glass) for thermal diffusion to form the N-type doped layer; way III: spin-coating a doping source containing nitrogen, phosphorus, arsenic or the like (such as phosphorus oxychloride) for thermal diffusion to form the N-type doped layer; and way IV: injecting ions containing elements such as nitrogen, phosphorus, arsenic or the like and performing high-temperature diffusion to form the N-type doped layer. It should be indicated that after a doping source is deposited for thermal diffusion, it is also required to remove the doping source through laser or the like.

At step S31, a second dielectric layer and a third dielectric layer are respectively prepared on the back and front surface of the silicon substrate.

Before step S31, the method may further comprise: performing the first conductivity type of diffusion at the positions of the protrusions between the recesses on the silicon substrate, so that diffusion is enabled at the positions of the protrusions on the back surface of the silicon substrate to obtain the first doped layer having the same conductivity type as the first doped region. The specific diffusion process may refer to the preceding text.

Furthermore, before step S41, the method may further comprise: texturing the positions of the protrusions between the recesses on the back surface of the silicon substrate to obtain the rough texture structure. The specific texturing process may refer to the preceding text.

Specifically, in the process of respectively preparing the second dielectric layer and the third dielectric layer on the back and front surface of the silicon substrate, the preparation is implemented depending on the specific composition types of the second dielectric layer and the third dielectric layer, which is not specifically limited therein. Correspondingly, the second dielectric layer and the third dielectric layer may be one of an aluminum oxide layer, a silicon nitride layer, a silicon oxynitride layer, a silicon carbide layer, an intrinsic amorphous silicon layer and a silicon oxide layer, or a combination thereof. In addition, when the second dielectric layer and the third dielectric layer each are set to have a multi-layer structure, the refractive index of each layer is set to successively decrease outward from the silicon substrate, and a magnesium fluoride layer having the lowest requirement for the refractive index may be prepared at the outermost layer.

In addition, before the third dielectric layer is prepared on the front surface of the silicon substrate, an electric field layer or a floating junction may be prepared first, specifically comprising performing phosphorus diffusion on the silicon substrate to obtain the electric field layer or performing boron diffusion to obtain the floating junction. In this case, the electric field layer or the floating junction serves as the FSF of the selective contact region buried solar cell.

At step S41, a conductive layer is prepared on the first conductive regions and the second conductive regions.

Specifically, when the second dielectric layer only covers regions between the first conductive regions and the second conductive regions in the silicon substrate, the conductive layer covers the entire back of the first conductive regions and the second conductive regions for electrical connection; when the second dielectric layer extends to cover the first conductive regions and the second conductive regions, the conductive layer covers the back of the remaining part that does not cover the second dielectric layer in the first conductive regions and the second conductive regions; and when the second dielectric layer covers the entire back surface of the silicon substrate, the conductive layer passes through the second dielectric layer as well as the first conductive regions and the second conductive regions through perforation or the like for electrical connection, so that first electrodes are formed on the first conductive regions and second electrodes are formed on the second conductive regions.

The embodiment of the disclosure has the following beneficial effects with respect to the related art:

1. The recesses are disposed at intervals on the back surface of the silicon substrate, and the first conductive regions and the second conductive regions are disposed alternately in the recesses, so that separation between the first conductive regions and the second conductive regions inside the recesses is implemented through a protrusion structure between the recesses of the silicon substrate; moreover, the recesses disposed have a lower width control requirement than existing trenches, and preparation of the recesses is easier than preparation of the existing trenches; moreover, when depositing the first dielectric layer and the first doped regions inside the recesses, the deposition effect thereof is better. In addition, a first conductive region having the first dielectric layer and the first doped region is disposed in one recess, and a second conductive region having a second doped region is disposed in another adjacent recess, so that technological processes can be reduced in preparation steps and the cost is lowered.

2. Since the arrangement of the recesses enables the first dielectric layer to be in contact with both bottom walls and sidewalls of the recesses, the carriers generated on the silicon substrate would also be easily separated through the first dielectric layer on the sidewalls of the recesses and selectively collected into the corresponding first doped regions, so that leakage current can be reduced and selective transport of the carriers in longitudinal and transverse directions can also be implemented, thereby facilitating multi-dimensional collection of the carriers on the bottom walls and sidewalls of the recesses.

3. Since the second dielectric layer disposed is at least one in number, passivation is performed on the back surface of the silicon substrate through the second dielectric layer having at least one layer and the first dielectric layer to bring a better passivation effect; and by controlling the refractive index of each layer to successively decrease outward from the silicon substrate, the inner back reflection of light in the long wave band at the silicon substrate can be improved, to increase a short-circuit current density.

4. A recess has a specific depth, and the hard mask is only in direct contact with the protrusion portion between two recesses so that the hard mask will not be in direct contact with the bottom of the recess to reduce impurity contamination, so that the hard mask yields a certain protection effect on the silicon substrate on the bottom wall of the recess, there is no need to worry that the hard mask will cause damage to the silicon substrate, and the damage caused by contact of the hard mask with the surface of the protrusion of the silicon substrate can also be eliminated in the subsequent texturing process.

5. In the process that the hard mask is used to selectively deposit the first doped regions, since the recesses are separated by the silicon substrate protrusion structure having a specific width, when the hard mask is used for covering one recess and performing deposition in another adjacent recess region, accurate alignment of the hard mask is not required and a moderate amount of deviation is allowed, so that the alignment of the hard mask gets simpler and then the technological difficulty is reduced.

6. In the related art, due to width and depth limitations to a groove region, a chemical solution cannot completely infiltrate the bottom of the groove for chemical wet texturing due to hydrophobicity of water and a silicon slice. However, in this embodiment, since the recesses are disposed and the back surface of the silicon substrate between adjacent recesses is the boss, it would be easier to obtain the rough texture structure by texturing than existing groove structures; moreover, reflection of light on the inner back surface of the silicon substrate is enhanced after the protrusions on the back surface of the silicon substrate are textured, thereby increasing the light absorption rate of the silicon substrate.

7. Since the first doped layers are disposed on regions between the recesses in the silicon substrate, it would be easier for the carriers in the first doped layer to selectively pass through the first dielectric layer on the sidewall of the adjacent recess to be separated and collected into the corresponding first doped region.

Embodiment 4

The fourth embodiment of the disclosure further provides a cell assembly comprising the selective contact region buried solar cell according to the preceding embodiment.

In the cell assembly in this embodiment, through the selective contact region buried solar cell provided, recesses are disposed at intervals on a back of a silicon substrate, and first conductive regions and second conductive regions are disposed alternately inside the recesses, so that separation between the first conductive regions and the second conductive regions inside the recesses is implemented through a protrusion structure between the recesses of the silicon substrate; moreover, the recesses disposed have a lower width control requirement than existing trenches, and preparation of the recesses is easier than preparation of the existing trenches. Further, when a first dielectric layer and first doped regions are deposited inside the recesses, the deposition effect is better. In addition, a first conductive region having the first dielectric layer and the first doped region is disposed in one recess, and a second conductive region having a second doped region is disposed in another adjacent recess, so that technological processes can be reduced in preparation steps and the cost is lowered. In addition, since the arrangement of the recesses enables the first dielectric layer to be in contact with both bottom walls and sidewalls of the recesses, the carriers generated on the silicon substrate would also be easily separated through the first dielectric layer on the sidewalls of the recesses and selectively collected into the corresponding first doped regions, so that leakage current can be reduced and selective transport of the carriers in longitudinal and transverse directions can also be implemented, thereby facilitating multi-dimensional collection of the carriers on the bottom walls and sidewalls of the recesses. Since a second dielectric layer disposed is at least one in number, multi-layer passivation is achieved on the back surface of the silicon substrate through the second dielectric layer having at least one layer, and inner back reflection is enhanced, thereby yielding a better passivation effect and a better inner back reflection effect and solving the existing problems of a high groove width control requirement and a poor passivation effect.

Embodiment 5

The fifth embodiment of the disclosure further provides a photovoltaic system comprising the cell assembly according to the preceding embodiments.

In the photovoltaic system in this embodiment, through the selective contact region buried solar cell provided in the cell assembly, recesses are disposed at intervals on a back of a silicon substrate, and first conductive regions and second conductive regions are disposed alternately inside the recesses, so that separation between the first conductive regions and the second conductive regions inside the recesses is implemented through a protrusion structure between the recesses of the silicon substrate; moreover, the recesses disposed have a lower width control requirement than existing trenches, and preparation of the recesses is easier than preparation of the existing trenches. Further, when a first dielectric layer and first doped regions are deposited inside the recesses, the deposition effect is better. In addition, a first conductive region having the first dielectric layer and the first doped region is disposed in one recess, and a second conductive region having a second doped region is disposed in another adjacent recess, so that technological processes can be reduced in preparation steps and the cost is lowered. In addition, since the arrangement of the recesses enables the first dielectric layer to be in contact with both bottom walls and sidewalls of the recesses, the carriers generated on the silicon substrate would also be easily separated through the first dielectric layer on the sidewalls of the recesses and selectively collected into the corresponding first doped regions, so that leakage current can be reduced and selective transport of the carriers in longitudinal and transverse directions can also be implemented, thereby facilitating multi-dimensional collection of the carriers on the bottom walls and sidewalls of the recesses. Since a second dielectric layer disposed is at least one in number, multi-layer passivation is achieved on the back surface of the silicon substrate through the second dielectric layer having at least one layer, and inner back reflection is enhanced, thereby yielding a better passivation effect and a better inner back reflection effect and solving the existing problems of a high groove width control requirement and a poor passivation effect.

It will be obvious to those skilled in the art that changes and modifications may be made, and therefore, the aim in the appended claims is to cover all such changes and modifications.

What is claimed is:

1. A back contact structure of a solar cell, the back contact structure comprising:
   a silicon substrate, the silicon substrate comprising a back surface comprising a plurality of recesses disposed at intervals such that a protrusion is formed between two adjacent recesses of the plurality of recesses;
   a plurality of first conductive regions and a plurality of second conductive regions disposed alternately in the plurality of recesses, wherein each first conductive region comprises a first dielectric layer and a first doped region which are disposed successively in the plurality of recesses, and each second conductive region consists of a second doped region;
   a second dielectric layer, wherein the second dielectric layer is at least one in number; and
   a conductive layer disposed on the plurality of first conductive regions and the plurality of second conductive regions;
   wherein
   a thickness of the plurality of first conductive regions is less than a depth of the plurality of recesses, and the first dielectric layer and the first doped region are enclosed inside the plurality of recesses;
   the second dielectric layer comprises a first portion, a second portion, and a third portion;
   the first portion is disposed on and covers a top surface of the first doped region, and the first portion is constrained on the plurality of recesses where the plurality of first conductive regions is disposed;
   the second portion is disposed on and covers a side wall of the plurality of recesses where the plurality of second conductive regions is disposed and a top surface of the second conductive region, and the second portion is constrained inside the plurality of recesses where the plurality of second conductive regions is disposed; and
   the third portion is disposed between the first portion and the second portion and is constrained on the protrusion.

2. The back contact structure of claim 1, wherein the plurality of first conductive regions is a P-type doped region, and the plurality of second conductive regions is an N-type doped layer; or the plurality of first conductive regions is an N-type doped region, and the plurality of second conductive regions is a P-type doped layer.

3. The back contact structure of claim 1, wherein the plurality of first conductive regions comprises doped polycrystalline silicon, doped silicon carbide or doped amorphous silicon.

4. The back contact structure of claim 1, wherein the first dielectric layer comprises a tunneling oxide layer, an intrinsic silicon carbide layer, an intrinsic amorphous silicon layer, or a combination thereof.

5. The back contact structure of claim 1, wherein the second dielectric layer comprises an aluminum oxide layer, a silicon nitride layer, a silicon oxynitride layer, an intrinsic silicon carbide layer, an intrinsic amorphous silicon layer, a silicon oxide layer, or a combination thereof.

6. The back contact structure of claim 1, wherein a part of the back surface of the silicon substrate between the plurality of first conductive regions and the plurality of second conductive regions comprises a rough texture structure.

7. The back contact structure of claim 1, wherein the first dielectric layer covers bottom walls and sidewalls of the plurality of recesses.

8. The back contact structure of claim 1, wherein the plurality of recesses is the shape of an arc, a trapezoid, or a square.

9. The back contact structure of claim 1, wherein a thickness of the first dielectric layer is 1-20 nm, and a thickness of the plurality of first conductive regions is greater than 20 nm.

10. The back contact structure of claim 1, wherein the second doped region has a junction depth of 0.01-1 μm, a sheet resistance of 10-500 ohm/sqr, and a surface concentration of 1E18-1E21 $cm^{-3}$.

11. The back contact structure of claim 1, wherein a depth of the plurality of recesses is 0.01-10 μm, and a distance between every two adjacent recesses is 20-500 μm.

12. The back contact structure of claim 2, wherein a width of the plurality of recesses of the P-type doped region is set to be 300-600 μm, and a width of the plurality of recesses of the N-type doped region is set to be 100-500 μm.

13. The back contact structure of claim 4, wherein the first dielectric layer comprises the tunneling oxide layer and the intrinsic silicon carbide layer.

14. The back contact structure of claim 4, wherein the tunneling oxide layer comprises one or more of a silicon oxide layer and an aluminum oxide layer.

15. The back contact structure of claim 5, wherein the second dielectric layer comprises the aluminum oxide layer and the intrinsic silicon carbide layer, or the second dielectric layer comprises the silicon oxide layer and the intrinsic silicon carbide layer, and a thickness of the second dielectric layer is greater than 25 nm.

16. The back contact structure of claim 15, wherein a thickness of the aluminum oxide layer or the silicon oxide layer in the second dielectric layer is less than 25 nm, and a thickness of the intrinsic silicon carbide layer in the second dielectric layer is greater than 10 nm.

17. The back contact structure of claim 5, wherein a magnesium fluoride layer is disposed at an outer layer of the second dielectric layer.

18. The back contact structure of claim 1, wherein the conductive layer comprises a transparent conductive oxide (TCO) film and/or a metal electrode.

19. The back contact structure of claim 18, wherein the metal electrode comprises a silver electrode, a copper electrode, an aluminum electrode, a tin-clad copper electrode, or a silver-clad copper electrode.

20. The back contact structure of claim 19, wherein the copper electrode is electro-plated copper or a physical vapor deposited copper electrode.

21. A selective contact region buried solar cell, comprising:
   the back contact structure of claim 1; and
   a third dielectric layer disposed on a front surface of the silicon substrate.

22. The selective contact region buried solar cell of claim 21, wherein the third dielectric layer comprises an aluminum oxide layer, a silicon nitride layer, a silicon oxynitride layer, a silicon carbide layer, an intrinsic amorphous silicon layer, a silicon oxide layer, or a combination thereof.

23. The selective contact region buried solar cell of claim 21, wherein the third dielectric layer comprises the silicon oxide layer and the silicon carbide layer, or the third dielectric layer comprises the aluminum oxide layer and the silicon carbide layer, and a thickness of the third dielectric layer is greater than 50 nm.

24. The selective contact region buried solar cell of claim 23, wherein a thickness of the aluminum oxide layer or the silicon oxide layer in the third dielectric layer is less than 40 nm, and a thickness of the silicon carbide layer in the third dielectric layer is greater than 10 nm.

25. The selective contact region buried solar cell of claim 21, wherein the silicon carbide layer in the third dielectric layer comprises at least one silicon carbide film; and refractive indexes of different silicon carbide films decrease from the front surface of the silicon substrate to outside.

26. The selective contact region buried solar cell of claim 22, wherein a magnesium fluoride layer is disposed at an outer layer of the third dielectric layer.

27. A cell assembly, comprising the selective contact region buried solar cell of claim 24.

* * * * *